US011315636B2

(12) United States Patent
Liang et al.

(10) Patent No.: US 11,315,636 B2
(45) Date of Patent: Apr. 26, 2022

(54) FOUR GATE, SPLIT-GATE FLASH MEMORY ARRAY WITH BYTE ERASE OPERATION

(71) Applicant: Silicon Storage Technology, Inc., San Jose, CA (US)

(72) Inventors: Hsuan Liang, Zhudong Township, Hsinchu County (TW); Man Tang Wu, Xinpu Township, Hsinchu County (TW); Jeng-Wei Yang, Zhubei (TW); Hieu Van Tran, San Jose, CA (US); Lihsin Chang, Hsinchu County (TW); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/784,183

(22) Filed: Feb. 6, 2020

(65) Prior Publication Data
US 2021/0110873 A1    Apr. 15, 2021

Related U.S. Application Data

(60) Provisional application No. 62/914,799, filed on Oct. 14, 2019.

(51) Int. Cl.
*G11C 16/16* (2006.01)
*G11C 16/04* (2006.01)
(Continued)

(52) U.S. Cl.
CPC .......... *G11C 16/16* (2013.01); *G11C 16/0425* (2013.01); *G11C 16/08* (2013.01);
(Continued)

(58) Field of Classification Search
CPC ...... G11C 16/16; G11C 16/0425; G11C 16/08; G11C 16/10; G11C 2216/04; H01L 27/11521
See application file for complete search history.

(56) References Cited

U.S. PATENT DOCUMENTS

| 5,029,130 | A | 7/1991 | Yeh |
| 6,181,607 | B1 * | 1/2001 | Lee ................... G11C 16/0425 |
| | | | 365/185.05 |

(Continued)

FOREIGN PATENT DOCUMENTS

TW    I625843    6/2018

OTHER PUBLICATIONS

Taiwanese Office Action dated Jul. 26, 2021 corresponding to the related Taiwanese Patent Application No. 11020712920.

*Primary Examiner* — Vanthu T Nguyen
(74) *Attorney, Agent, or Firm* — DLA Piper LLP (US)

(57) ABSTRACT

A memory cell array with memory cells arranged in rows and columns, first sub source lines each connecting together the source regions in one of the rows and in a first plurality of the columns, second sub source lines each connecting together the source regions in one of the rows and in a second plurality of the columns, a first and second erase gate lines each connecting together all of the erase gates in the first and second plurality of the columns respectively, first select transistors each connected between one of first sub source lines and one of a plurality of source lines, second select transistors each connected between one of second sub source lines and one of the source lines, first select transistor line connected to gates of the first select transistors, and a second select transistor line connected to gates of the second select transistors.

20 Claims, 26 Drawing Sheets

(51) Int. Cl.
    *G11C 16/08*         (2006.01)
    *G11C 16/10*         (2006.01)
    *H01L 27/11521*    (2017.01)

(52) U.S. Cl.
    CPC .......... *G11C 16/10* (2013.01); *G11C 2216/04* (2013.01); *H01L 27/11521* (2013.01)

(56) References Cited

U.S. PATENT DOCUMENTS

| | | | |
|---|---|---|---|
| 6,741,501 B2* | 5/2004 | Kobayashi | H01L 27/105 257/E21.682 |
| 7,608,882 B2 | 10/2009 | Lung | |
| 7,868,375 B2 | 1/2011 | Liu et al. | |
| 8,237,212 B2* | 8/2012 | Lee | G11C 16/3459 257/316 |
| 9,286,982 B2 | 3/2016 | Tran | |
| 9,443,594 B2* | 9/2016 | Jeon | G11C 16/08 |
| 10,269,440 B2 | 4/2019 | Guo et al. | |
| 10,812,084 B2* | 10/2020 | Strukov | G11C 16/22 |
| 2002/0176286 A1 | 11/2002 | Bergemont | |
| 2003/0206455 A1 | 11/2003 | Hsu | |
| 2007/0047302 A1 | 3/2007 | Lee | |
| 2009/0279361 A1 | 11/2009 | Lojek | |
| 2013/0223148 A1* | 8/2013 | Seo | H01L 27/11517 365/185.11 |
| 2016/0042790 A1 | 2/2016 | Tran | |
| 2019/0355424 A1 | 11/2019 | Liang et al. | |

\* cited by examiner

FOUR GATE, SPLIT-GATE FLASH MEMORY ARRAY WITH BYTE ERASE OPERATION

RELATED APPLICATIONS

This application claims the benefit of U.S. Provisional Application No. 62/914,799 filed on Oct. 14, 2019, and which is incorporated herein by reference.

FIELD OF THE INVENTION

The present invention relates to non-volatile memory arrays.

BACKGROUND OF THE INVENTION

Split gate non-volatile memory cells having four gates per memory cell, and arrays of such cells, are well known. For example, U.S. Pat. No. 7,868,375 discloses an array of split gate non-volatile memory cells, with each memory cell having four gates, and is incorporated herein by reference for all purposes. The four-gate memory cell is shown in FIG. 1. Each memory cell 10 includes source and drain regions 14/16 formed in a semiconductor substrate 12, with a channel region 18 there between. A floating gate 20 is formed vertically over and insulated from (and controls the conductivity of) a first portion of the channel region 18, and over a portion of the source region 14. A select gate 28 is disposed vertically over and insulated from (and controls the conductivity of) a second portion of the channel region 18. A control gate 22 is disposed vertically over and insulated from the floating gate 20. An erase gate 30 is disposed vertically over the source region 14, and preferably includes a notch that faces an edge of the floating gate 20.

The memory cell is erased (where electrons are removed from the floating gate 20) by placing a high positive voltage on the erase gate 30, which causes electrons on the floating gate 20 to tunnel through the intermediate insulation from the edge of the floating gate 20 to the erase gate 22 via Fowler-Nordheim tunneling (as graphically shown in FIG. 1).

The memory cell is programmed (where electrons are placed on the floating gate 20) by placing positive program voltages on the control gate 22, select gate 28, erase gate 30 and source region 14. Electron current will flow from the drain region 16 towards the source region 14. The electrons will accelerate and become heated when they reach the gap between the select gate 28 and the floating gate 20. Some of the heated electrons will be injected through the intermediate insulation onto the floating gate 20 due to the attractive electrostatic force from the floating gate 20 (as graphically shown in FIG. 1).

The memory cell is read by placing positive read voltages on the drain region 16, control gate 22 and select gate 28 (which turns on the channel region 18 under the select gate 28). If the floating gate 20 is positively charged (i.e. erased of electrons and positively voltage coupled to the control gate 22), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region 18 under the floating gate 20 is mostly or entirely turned off despite the positive voltage coupling to the control gate 22, and current will not flow (or there will be little flow) across the channel region 18, which is sensed as the programmed or "0" state.

FIG. 1 also shows how pairs 11 of memory cells 10 can be formed sharing a single source region 14 and erase gate 30. Two adjacent pairs 11 of memory cells 10 can be arranged end to end and share a single drain region 16.

FIG. 2 illustrates a conventional array configuration of memory cells 10. The memory cells 10 are arranged in rows and columns. Each column includes pairs 11 of memory cells 10 that are arranged end to end. Each column is commonly referred to as an active region, and adjacent active regions are insulated from each other by insulation material formed in what is commonly referred to as an isolation region. Each row of memory cells includes a word line WL that electrically connects together all the select gates 28 for that row of memory cells. Preferably, the select gates are formed contiguously across the entire row, and constitute the word line WL (i.e. the select gate 28 for each memory cell 10 is that portion of the word line WL that is disposed over that memory cell's channel region 18). Each row of memory cells 10 also includes a control gate line CG that electrically connects together all the control gates 22 for that row of memory cells 10. Preferably, the control gates 22 are formed contiguously across the entire row, and constitute the control gate line CG (i.e. the control gate 22 for each memory cell 10 is that portion of the control gate line CG that is disposed over that memory cell's floating gate 20).

Each row of memory cell pairs 11 includes a source line SL that electrically connects together all the source regions 14 for that row of memory cell pairs 11. The source line SL can be a continuous diffusion region extending across the active/isolation regions, or can include a separate conductive line that includes periodic contacts to the source regions 14. Each row of memory cell pairs 11 includes an erase gate line EG that electrically connects together all the erase gates 30 for that row of memory cell pairs 11. Preferably, the erase gates 30 are formed contiguously across the entire row of memory cell pairs 11, and constitute the erase gate line EG (i.e. the erase gate 30 for each memory cell pair 11 is that portion of the erase gate line EG that is disposed over that memory cell pair's source region 14). Each column of memory cells includes a bit line BL that electrically connects together all of the drain regions 16 for that column of memory cells.

FIG. 2 shows just two rows of memory cell pairs 11, and four columns of memory cells. However, it should be understood that a memory array having such an architecture can include hundreds or even thousands of rows and columns.

As detailed above, memory cells 10 are erased by placing a high voltage on the erase gate 30. Thus, an entire row of memory cell pairs 11 (i.e., two rows of memory cells 10) is erased at one time by applying a high voltage to the row's erase gate line EG. One limitation of this architecture is that if there is a need to change information stored in just a portion of a memory cell pair 11 row, such as single byte of information, the entire row of memory cell pairs 11 would have to be erased and reprogrammed. There is no ability to erase just a portion of one row of the memory cell pairs 11.

There is a need for a memory array architecture that allows for selective erasure of just a portion of a row of memory cell pairs.

BRIEF SUMMARY OF THE INVENTION

The aforementioned problems and needs are addressed by a memory device that includes a plurality of memory cells configured in rows and columns on a semiconductor substrate. Each of the memory cells includes source and drain regions formed in the substrate and defining a channel region of the substrate extending there between, a floating gate disposed vertically over and insulated from a first portion of the channel region, a select gate disposed vertically over and insulated from a second portion of the channel region, a control gate disposed vertically over and insulated from the floating gate, and an erase gate disposed vertically over and insulated from the source region. A plurality of word lines each is electrically connecting together all of the select gates for one of the rows of the memory cells. A plurality of control gate lines each is electrically connecting together all of the control gates for one of the rows of the memory cells. A plurality of bit lines each is electrically connecting together all of the drain regions for one of the columns. A plurality of first sub source lines each is electrically connecting together the source regions of the memory cells that are in one of the rows of the memory cells and are in a first plurality of the columns. A plurality of second sub source lines each is electrically connecting together the source regions of the memory cells that are in one of the rows of the memory cells and are in a second plurality of the columns, wherein the first plurality of the columns is different from the second plurality of the columns. A first erase gate line is electrically connecting together all of the erase gates of the memory cells in the first plurality of the columns. A second erase gate line is electrically connecting together all of the erase gates of the memory cells in the second plurality of the columns. A plurality of first select transistors each is connected between one of first sub source lines and one of a plurality of source lines. A plurality of second select transistors each is connected between one of second sub source lines and one of the source lines. A first select transistor line is connected to gates of the first select transistors. A second select transistor line is connected to gates of the second select transistors.

A memory device includes a plurality of memory cells configured in alternating even and odd rows, and in columns, on a semiconductor substrate. Each of the memory cells includes source and drain regions formed in the substrate and defining a channel region of the substrate extending there between, a floating gate disposed vertically over and insulated from a first portion of the channel region, a select gate disposed vertically over and insulated from a second portion of the channel region, a control gate disposed vertically over and insulated from the floating gate, and an erase gate disposed vertically over and insulated from the source region. A plurality of word lines each is electrically connecting together all of the select gates for one of the rows of the memory cells. A plurality of control gate lines each is electrically connecting together all of the control gates for one of the rows of the memory cells. A plurality of bit lines each is electrically connecting together all of the drain regions for one of the columns. A plurality of first sub source lines each is electrically connecting together the source regions of the memory cells that are in one of the rows of the memory cells and are in a first plurality of the columns. A plurality of second sub source lines each is electrically connecting together the source regions of the memory cells that are in one of the rows of the memory cells and are in a second plurality of the columns, wherein the first plurality of the columns is different from the second plurality of the columns. A first erase gate line is electrically connecting together all of the erase gates of the memory cells that are in the even rows of the memory cells and are in the first plurality of the columns. A second erase gate line is electrically connecting together all of the erase gates of the memory cells that are in the odd rows of the memory cells and are in the first plurality of the columns. A third erase gate line is electrically connecting together all of the erase gates of the memory cells that are in the even rows of the memory cells and are in the second plurality of the columns. A fourth erase gate line is electrically connecting together all of the erase gates of the memory cells that are in the odd rows of the memory cells and are in the second plurality of the columns. A plurality of first select transistors each is connected between one of first sub source lines and one of a plurality of source lines. A plurality of second select transistors each is connected between one of second sub source lines and one of the source lines. A first select transistor line is connected to gates of the first select transistors. A second select transistor line is connected to gates of the second select transistors.

Other objects and features of the present invention will become apparent by a review of the specification, claims and appended figures.

DETAILED DESCRIPTION OF THE INVENTION

Figure 1:
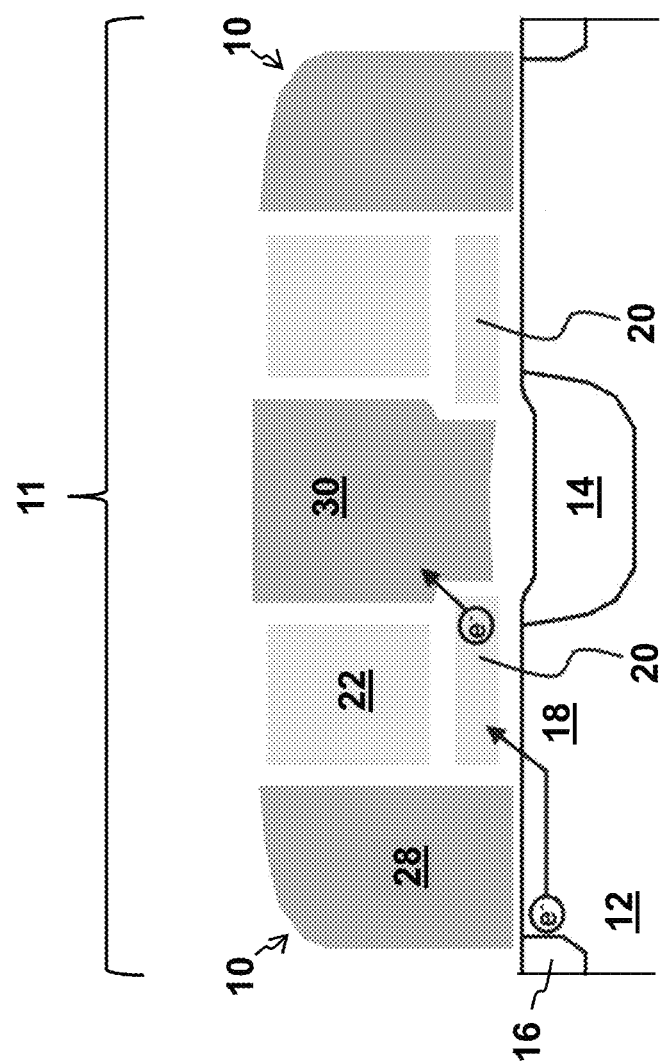
FIG. 1 is a cross sectional view of a conventional memory cell.

The present invention is an array architecture that provides the ability not only to erase just a segment of the row of memory cell pairs 11, but also just a single row of memory cells 10 in that segment. FIG. 3 illustrates a first embodiment for the memory cell pairs 11 of memory cells 10 of FIG. 1. The architecture of FIG. 3 is similar to the architecture of FIG. 2. However, instead of having a single source line SL extending along and electrically connecting together all the source regions 14 for the entire length of a row of memory cell pairs 11, each row of memory cell pairs 11 includes a plurality of sub source lines SSL, where each sub source line SSL only extends across and electrically connects together a subset of the source regions for each row of memory cell pairs 11 (i.e., a subrow of memory cell pairs 11). Specifically, the rows of memory cell pairs 11 are divided up into regions R (i.e., distinct pluralities of the columns of the memory cells), where each sub source line SSL only extends across and electrically connects together the source regions for that portion of the row of memory cell pairs 11 inside of the one region R. FIG. 3 shows two regions R1 and R2, with each region R being two memory cells 10 wide (i.e., two columns wide, with each subrow of memory cells includes two memory cells 10, and therefore each subrow of memory cell pairs 11 includes four memory cells 10). However, the number of regions R and their widths (i.e., the number of columns of memory cells 10 in the region R) can vary. For example, each subrow of memory cells 10 within a region R can include enough memory cells to store one byte (8 bits) of data. Alternatively, the subrow of memory cells 10 within a region R can include enough memory cells to store one word of data (16 or 32 bits). The number of rows of memory cell pairs 11 in the memory array can vary as needed.

Each subrow of memory cell pairs 11 within any given region R has its own sub source line SSL. Therefore, each region R has its own set of sub source lines SSL. Each row of memory cell pairs 11 also has its own source line SL extending in the row direction and extending across all the regions R. Each sub source line SSL in any given row of memory cell pairs 11 is connected to its source line SL by a respective select transistor 34 (i.e., the source/drain channel path of the select transistor 34 is connected between the sub source line SSL and source line SL). Each column of select transistors 34 is operated by a select transistor line STL (i.e., the select transistor line STL is connected to the gates of the respective select transistors 34) that is used to activate (i.e., make the source/drain channel paths conductive to electrically connect the SSLs to the SL's) or deactivate (i.e. make the source/drain channel paths non-conductive to electrically disconnect the SSL's from the SL's) the column of select transistors 34 connected thereto. The select transistors 34 are activated by applying a voltage on the select transistor line STL that exceeds the threshold voltage of the transistors 34. The transistors 34 are deactivated by applying no or zero voltage, or a low voltage below the threshold voltage of the transistors 34. Therefore, for any given row of memory cell pairs 11, the sub source lines SSL in that row are electrically isolated from their source line SL and from the other sub source lines SSL in that row when all the select transistors 34 in that row are deactivated.

Figure 2:
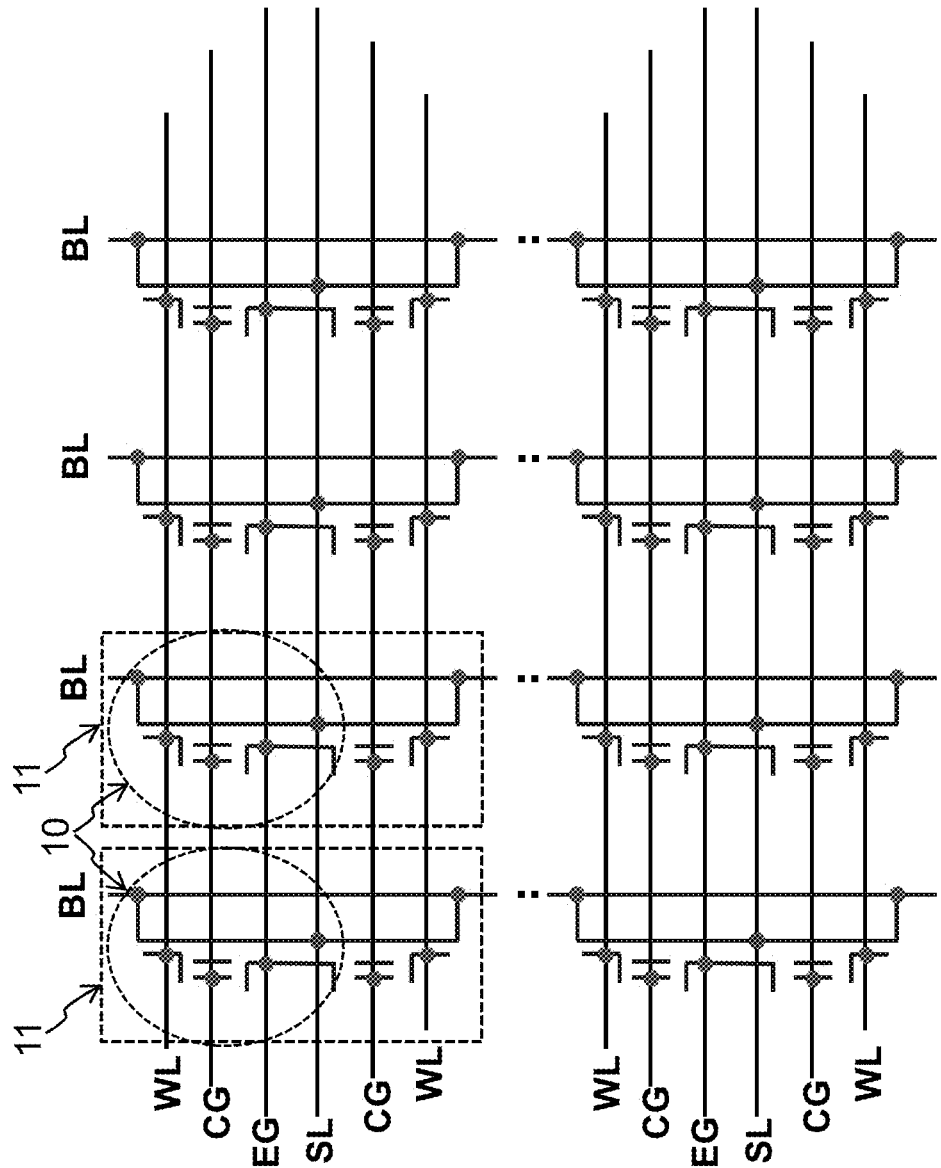
FIG. 2 is a diagram showing a conventional memory array architecture.
Figure 3:
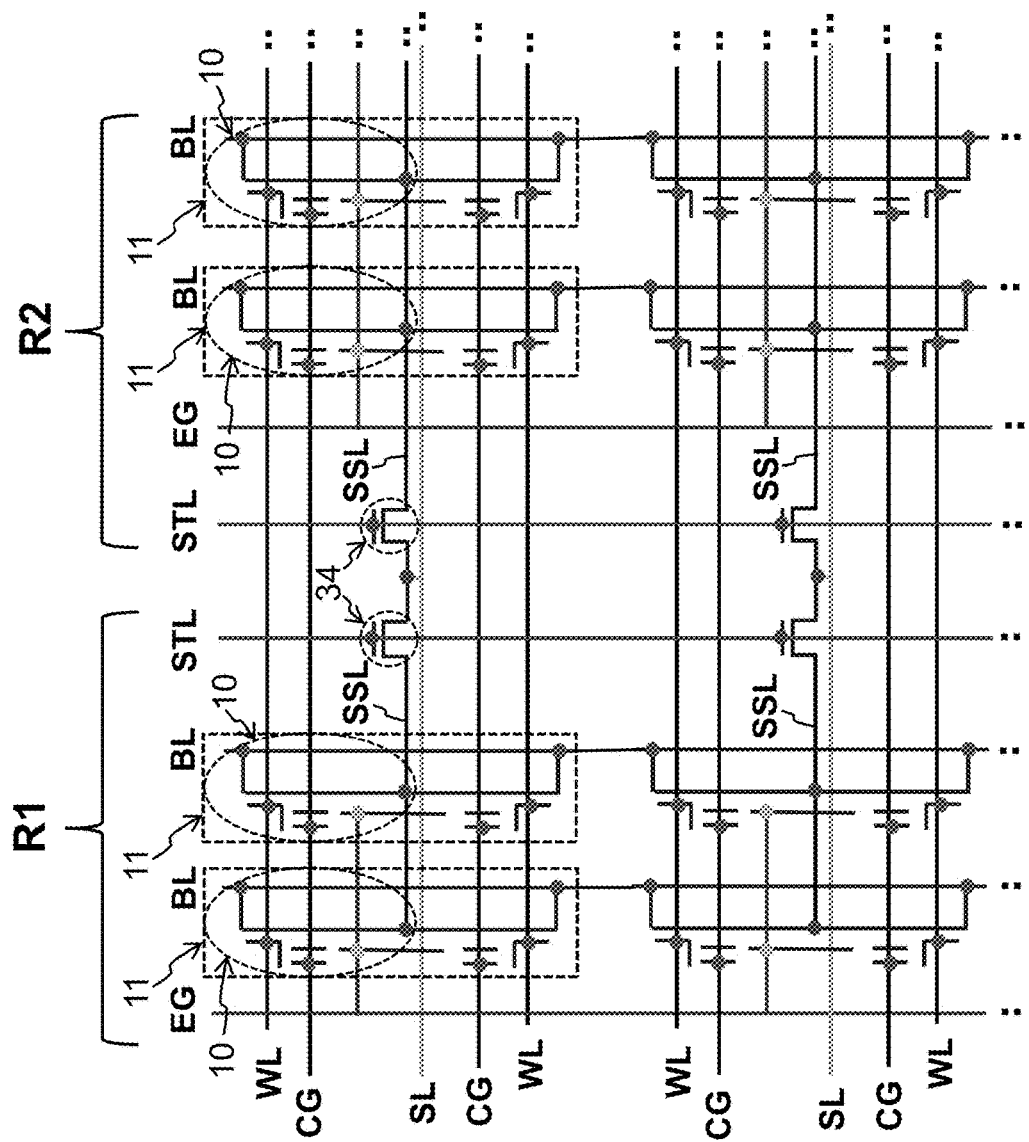
FIG. 3 is a diagram showing a first embodiment of a memory array architecture.

The array architecture in FIG. 3 also includes erase gate lines EG that extend primarily in the column direction instead of the row direction as shown in FIG. 2, but also extend in the row direction where each erase gate line EG electrically connects together all the erase gates 30 in one, and only one, of the regions R. So, for example, the erase gate line EG for region R1 electrically connects together all of the erase gates 30 in region R1 (i.e., the erase gates 30 for all the subrows of memory cell pairs 11 in region R1), but is electrically isolated from the erase gates 30 for memory cells in the other regions R.

Figure 4:
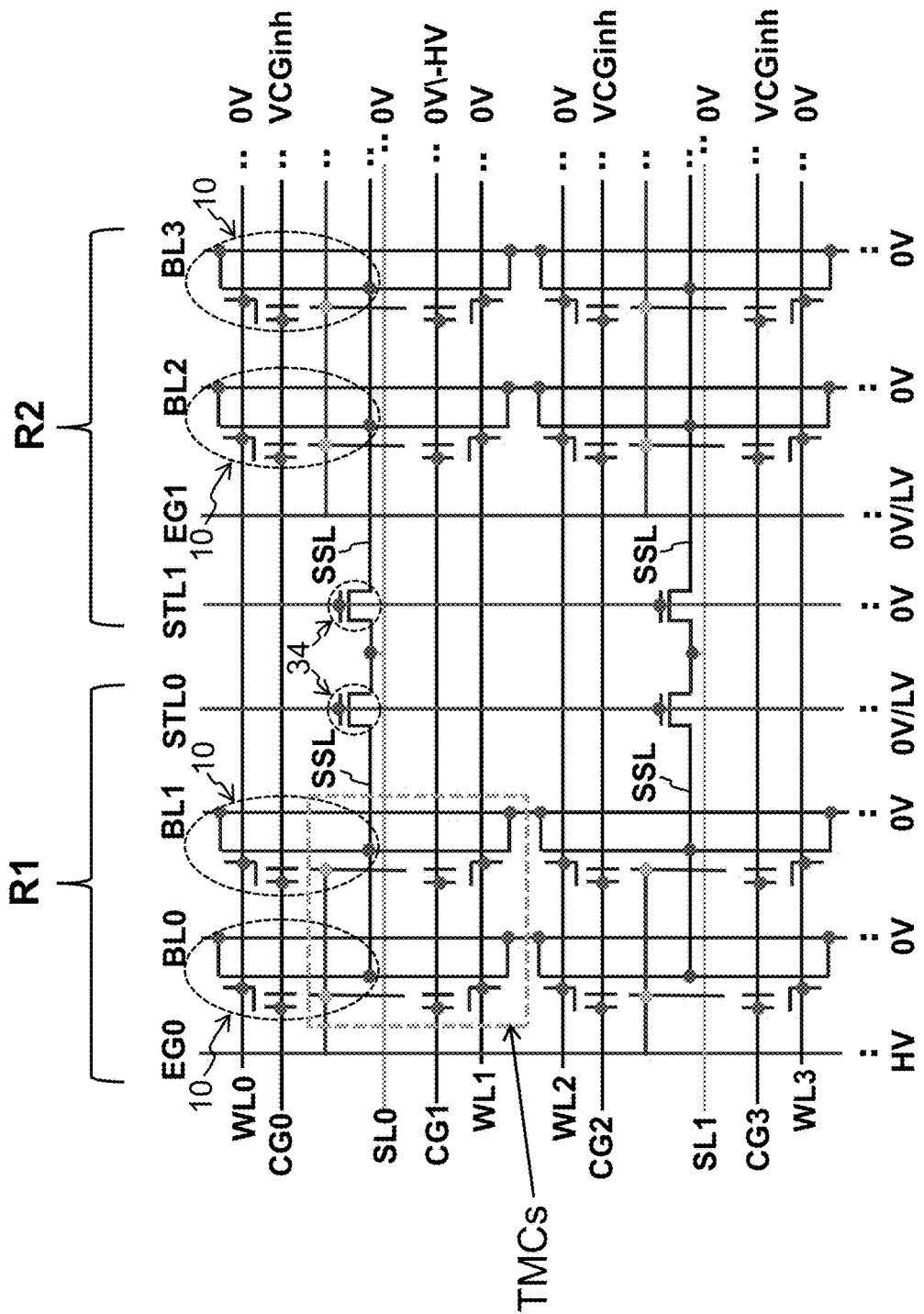
FIG. 4 is a diagram showing exemplary erase operation voltages for the first embodiment of a memory array architecture.

The above described array configuration allows for a single subrow of memory cells 10 to be erased, without disturbing the programming state of any other memory cells 10 in the memory array (including the other memory cells 10 in the same row, and the other memory cells 10 in a different row but in the same subrow of memory cell pairs 11). FIG. 4 illustrates exemplary voltages that can be applied to the memory array of FIG. 3 to erase just one of the subrows of memory cells 10. Specifically, in order to erase the memory cells 10 on word line WL1 and control gate line CG1 in region R1, (i.e., the target memory cells TMCs), 0V is applied to all the bit lines BL, all the word lines WL, and all the source lines SL. A high positive voltage HV (e.g. greater than about 7V) is applied to EG0, and 0V or a low positive voltage LV (e.g., less than 3V) is applied to all the other erase gate lines EG. 0V is applied to CG1, and a positive inhibit voltage VCGinh (e.g. greater than about 5V) is applied to all the other control gate lines CG. 0V or a low positive voltage LV (e.g., less than 3V) is applied to STL0, and 0V is applied to all the other select transistor lines STL. These voltages result in the target memory cells TMCs in region R1 in the row corresponding to WL1 being erased (by the high positive voltage on EG0). The other memory cells 10 in the same row as the target memory cells TMCs are not erased because no high voltage is applied to their erase gates. The other memory cells in the same columns as the target memory cells TMCs are not erased because the inhibit voltage VCGinh applied to their control gates is high enough to inhibit any tunneling to the erase gate, yet is not high enough to cause any tunneling to the control gate (because the floating gate will see positive voltages on multiple sides thereof thus no erasure will occur to just one side or corner edge). To enhance erasure, a negative voltage (e.g. −HV) could be applied to CG1, instead of 0V.

Figure 5:
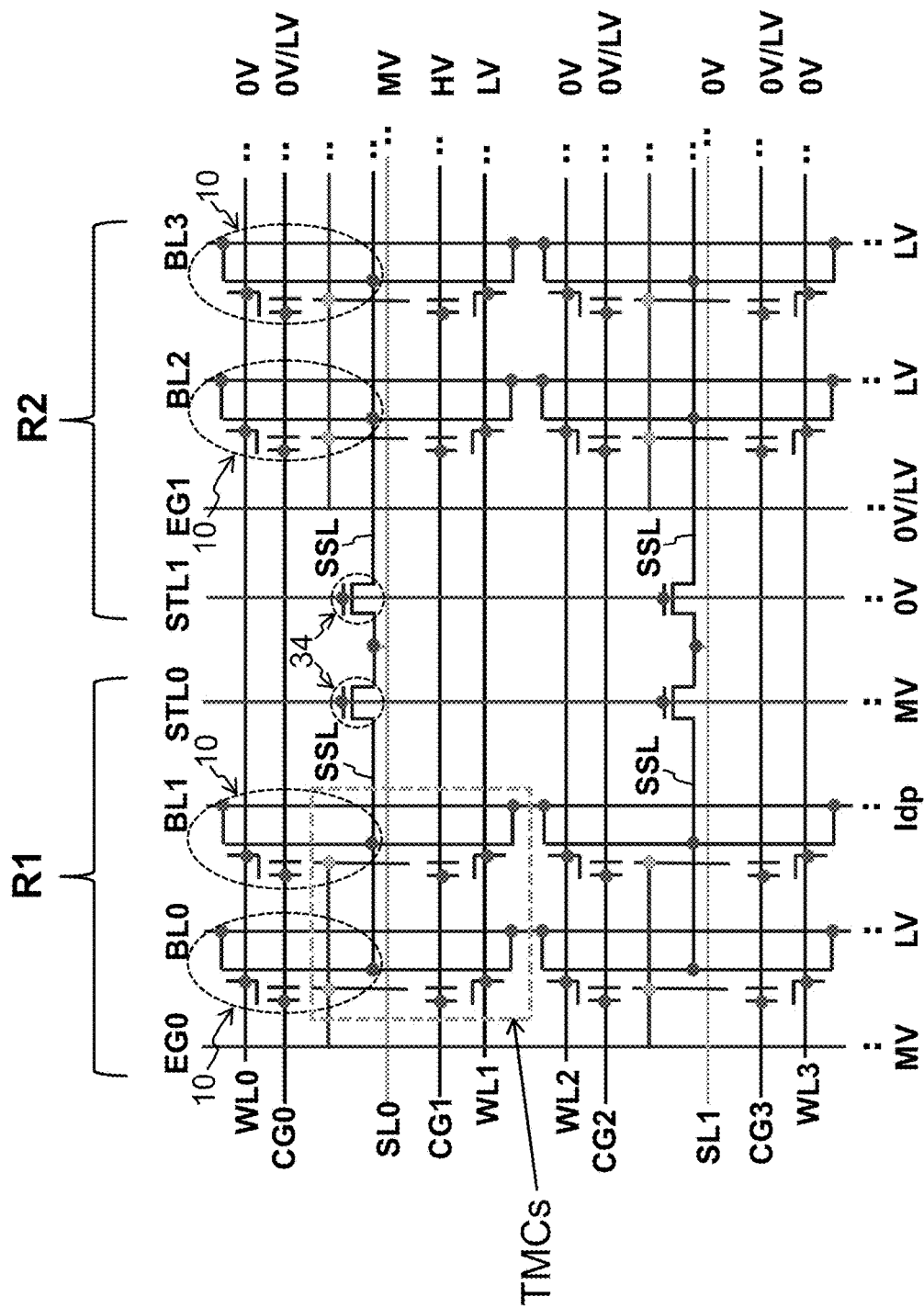
FIGS. 5-6 are diagrams showing exemplary program operation voltages for the first embodiment of a memory array architecture.

FIG. 5 illustrates exemplary voltages for programming one of the TMCs (right hand memory cell 10 of the TMCs). The voltage MV applied to STL0 is greater than the threshold voltage of the select transistors 34, so applying MV to SL0 turns on the select transistors 34 in region R1 (so that all the sub source lines SSL in region 1 are coupled to their respective source lines SL). A zero voltage is applied to STL1, so the select transistors 34 in region R2 remain turned off. Only the targeted memory cell receives the right combination of voltages and current necessary for programming by hot electron injection as described above on its word line WL (e.g., LV), control gate line CG (e.g., HV), erase gate line EG (e.g., MV), sub source line SSL (e.g., MV) and/or bit line BL (e.g., Idp).

Figure 6:
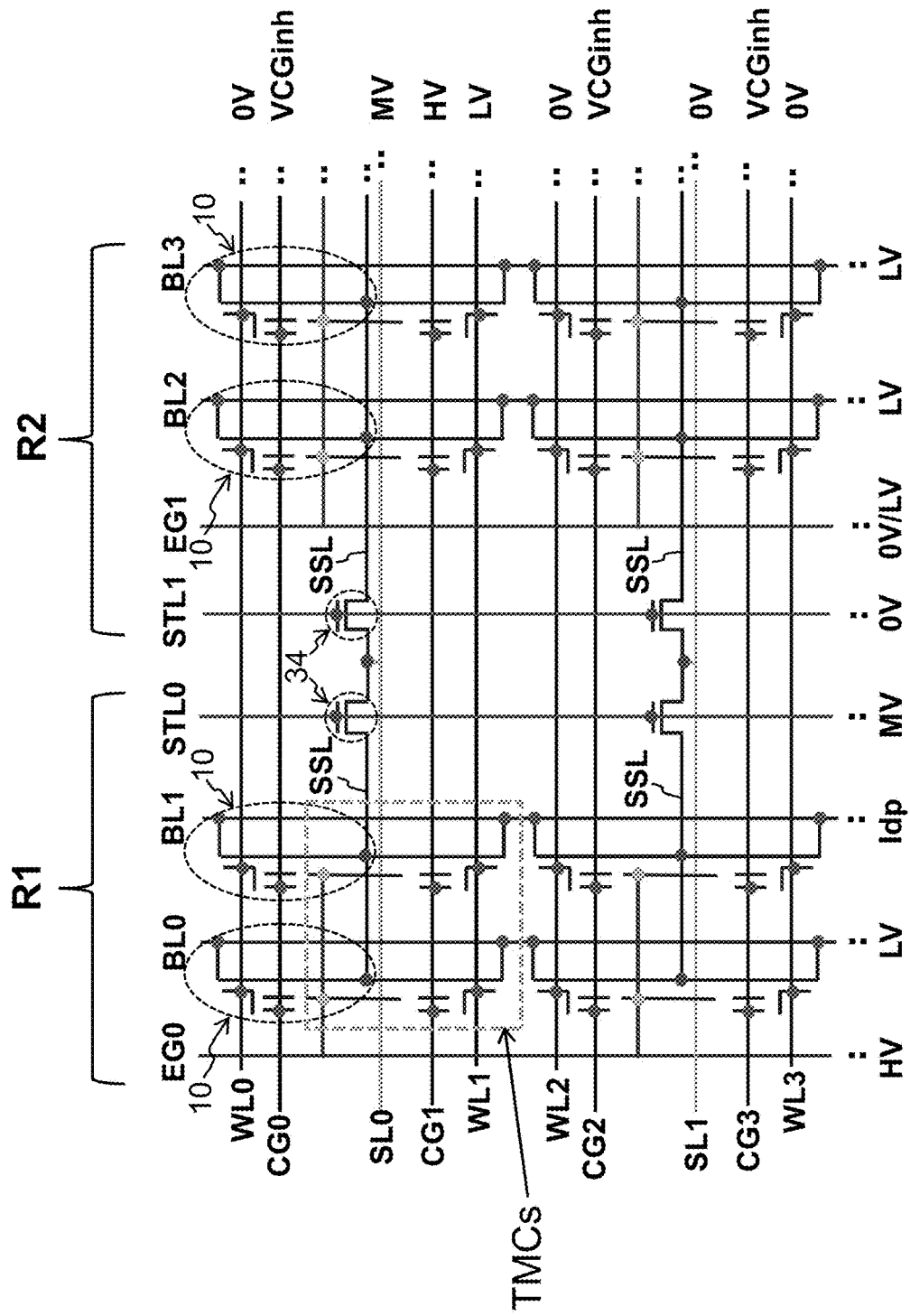

FIG. 6 illustrates an alternate combination of exemplary voltages for programming one of the TMCs (right hand memory cell 10 of the TMCs), which is the same as those shown in FIG. 5 except a high voltage (HV) is applied to EG0 and inhibit positive voltages VCGinh are applied to the control gate lines CG for non-target memory cells.

Figure 7:
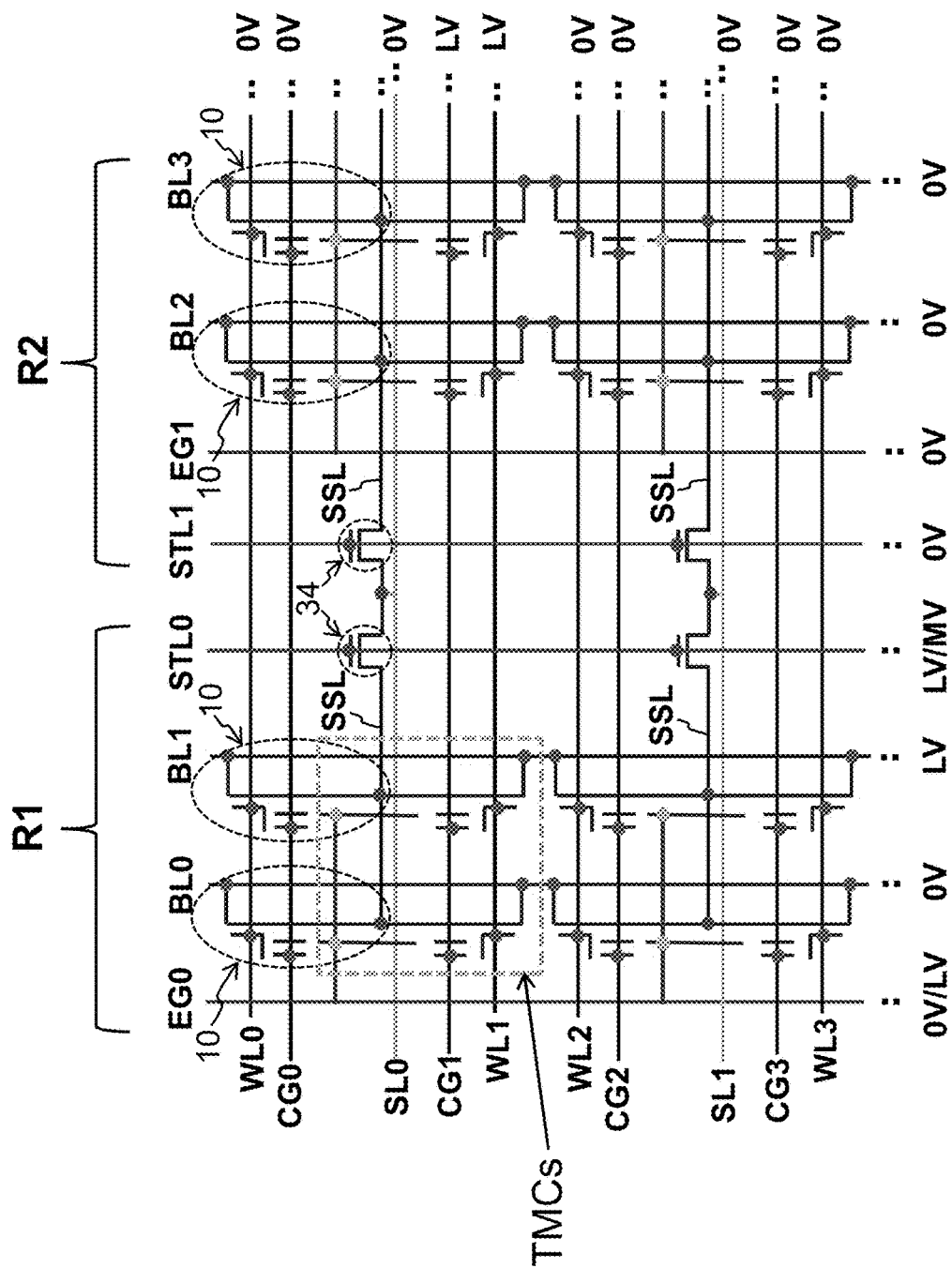
FIG. 7 is a diagram showing exemplary read operation voltages for the first embodiment of a memory array architecture.

FIG. 7 illustrates exemplary voltages for reading one of the TMCs (right hand memory cell 10 of the TMCs). Only the targeted memory cell receives the requisite read voltage combination as described above on its word line WL (e.g., LV), control gate line CG (e.g., LV), erase gate line EG (e.g., 0V or LV), sub source line SSL (e.g., 0V) and/or bit line BL (e.g., LV). Table 1 below summarizes the exemplary, non-limiting, voltages as indicated in the figures for all the various embodiments herein:

TABLE 1

| LV | <3 V |
| HV | >7 V |
| VCGinh | >5 V |
| MV | 3 V < MV < 7 V |
| Idp | 1-3 uA |

Figure 8:
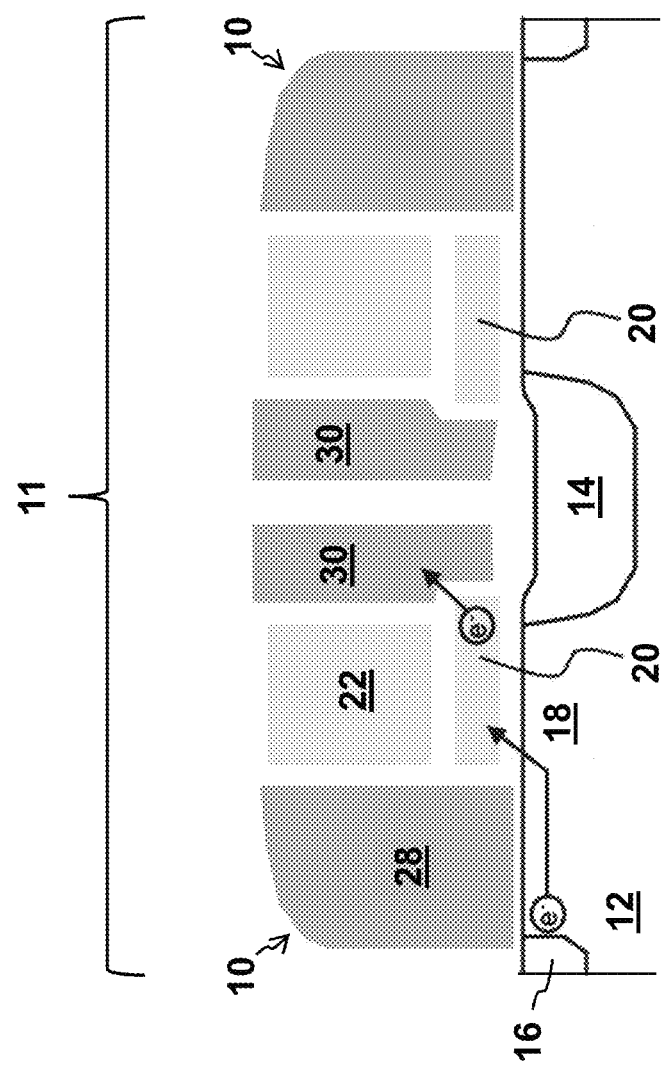
FIG. 8 is a cross sectional view of a second embodiment of a memory cell.
Figure 9:
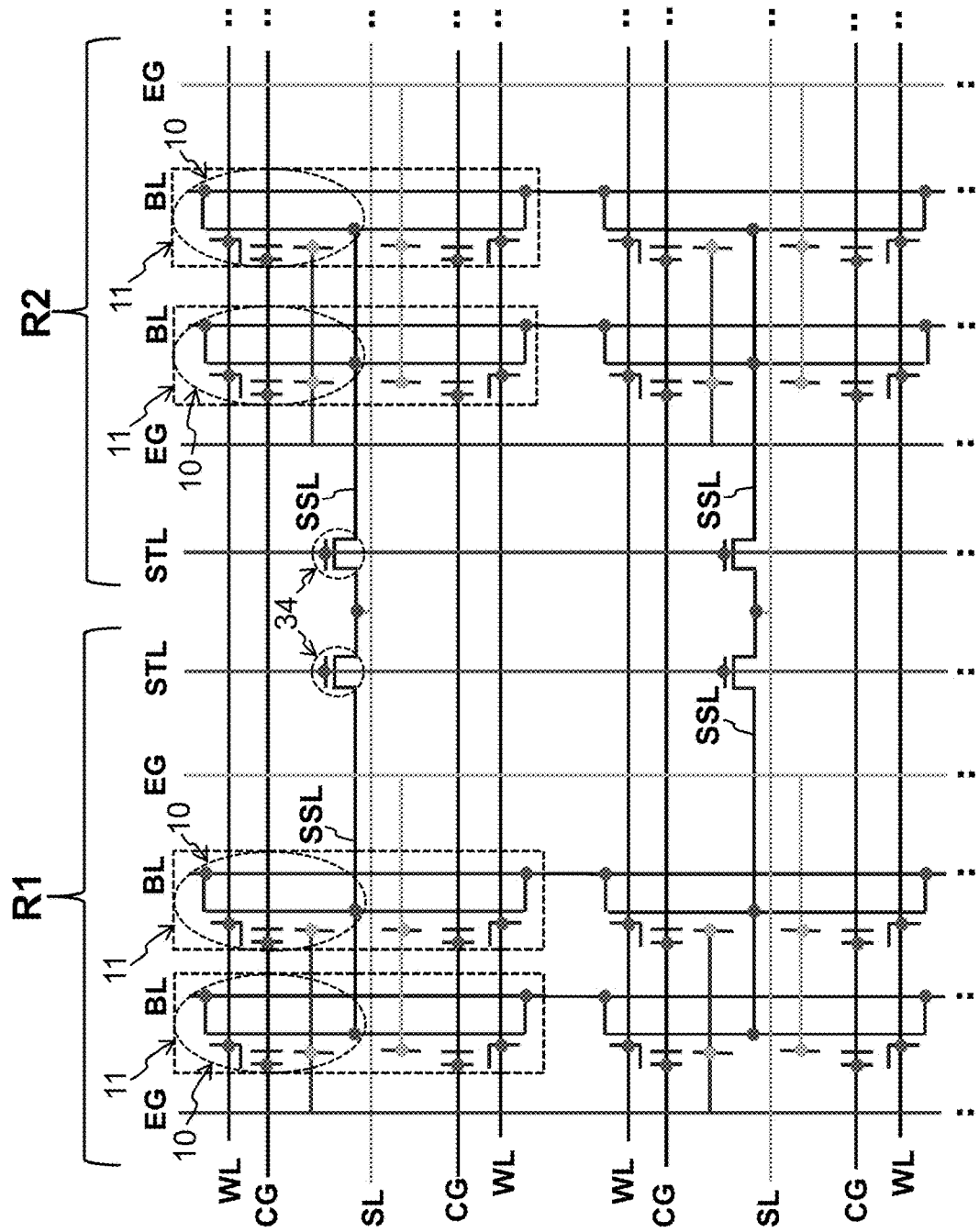
FIG. 9 is a diagram showing a second embodiment of a memory array architecture.

FIGS. 8-13 illustrate a second embodiment, which is similar to the embodiment of FIGS. 3-7, except that separate erase gates 30 are formed for each memory cell 10 in the pair of memory cells 11 (i.e., each of the memory cells 10 sharing a common source region 14 has its own erase gate 30) as shown in FIG. 8. FIG. 9 illustrates the memory cell array architecture for the memory cell pair configuration of FIG. 8, which is the same as that shown in FIG. 3 except that each region R of memory cells 10 includes two erase gate lines EG instead of one. Specifically, for each region R, one erase gate line EG electrically connects together all the erase gates 30 in the odd rows of memory cells 10, and the other erase gate line EG electrically connects together all the erase gates 30 in the even rows of memory cells 10, for that region R. This means for any given memory cell pair 11, the two erase gates 30 are connect to different erase gate lines EG. By using two erase gate lines in each region R instead of one, disturb stress on adjacent, non-targeted cells can be reduced.

Figure 10:
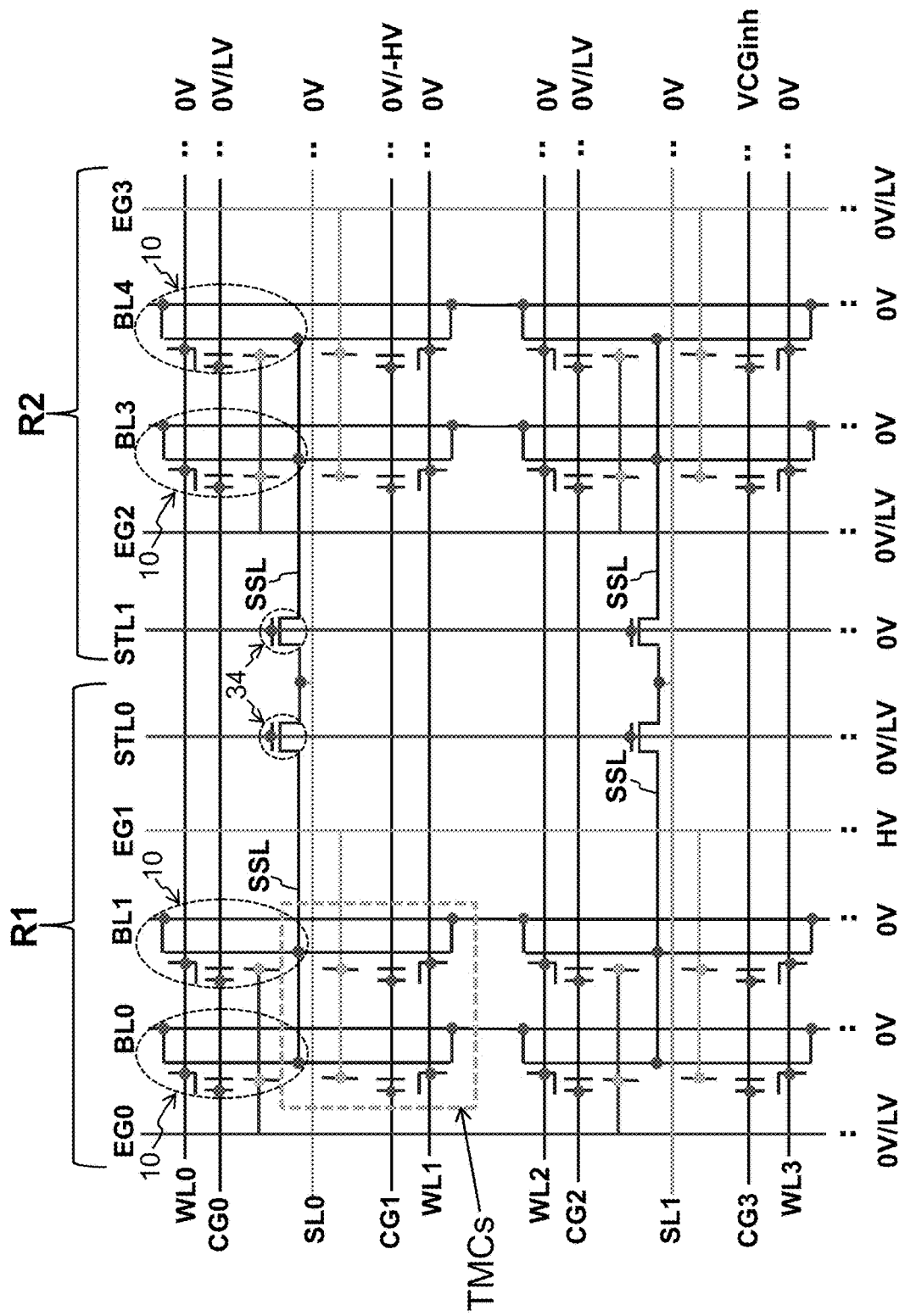
FIG. 10 is a diagram showing exemplary erase operation voltages for the second embodiment of a memory array architecture.
Figure 11:
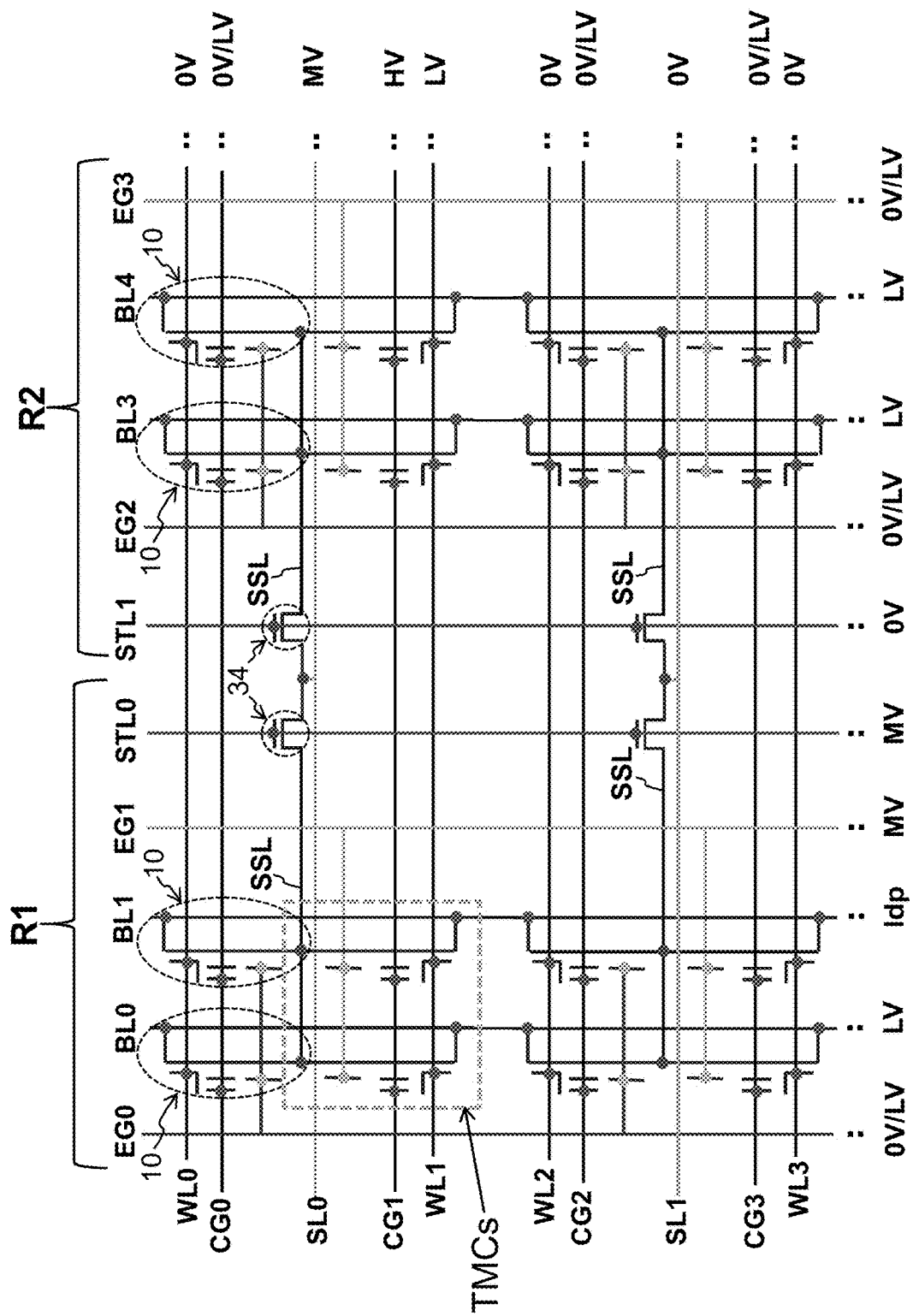
FIGS. 11-12 are diagrams showing exemplary program operation voltages for the second embodiment of a memory array architecture.
Figure 12:
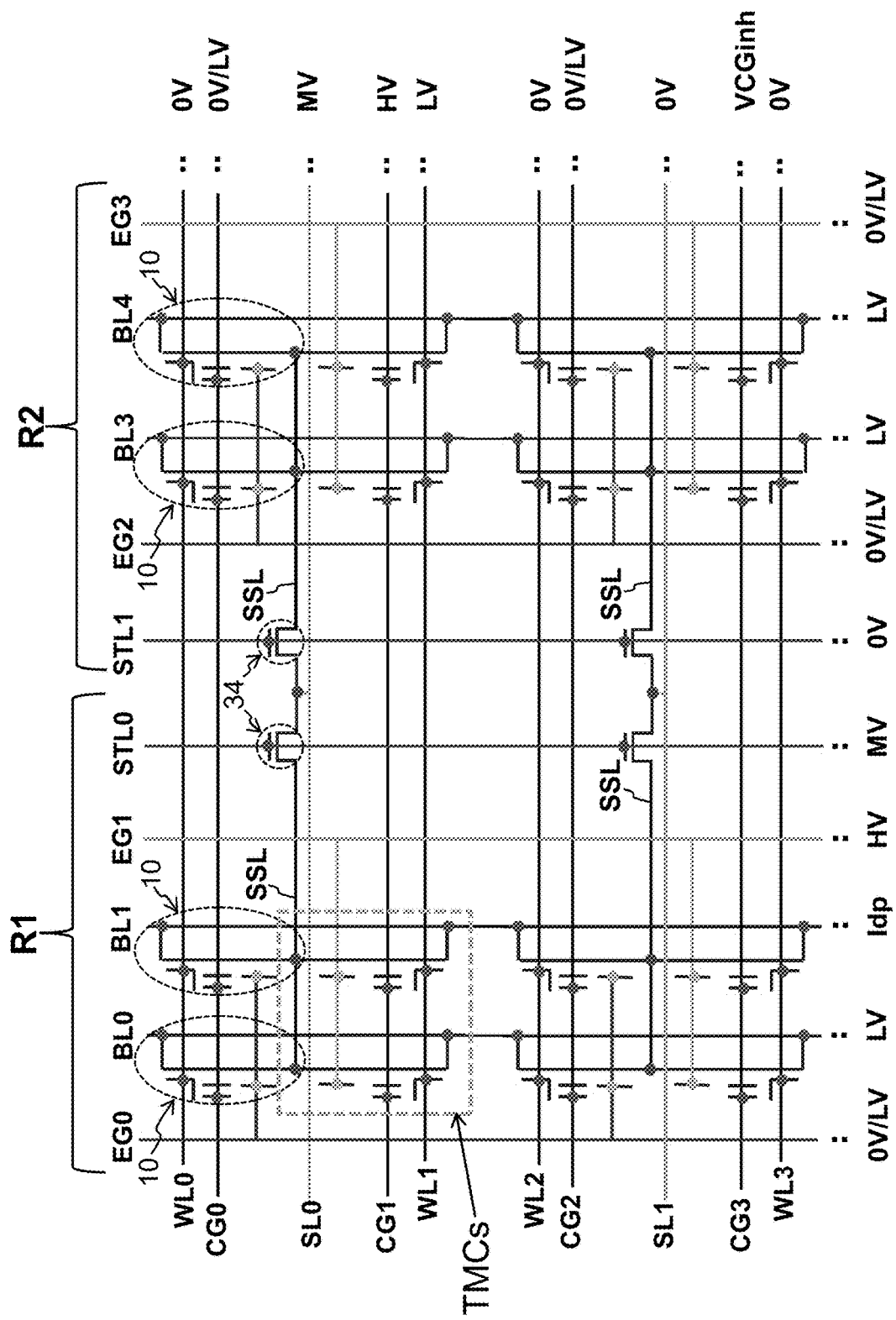
Figure 13:
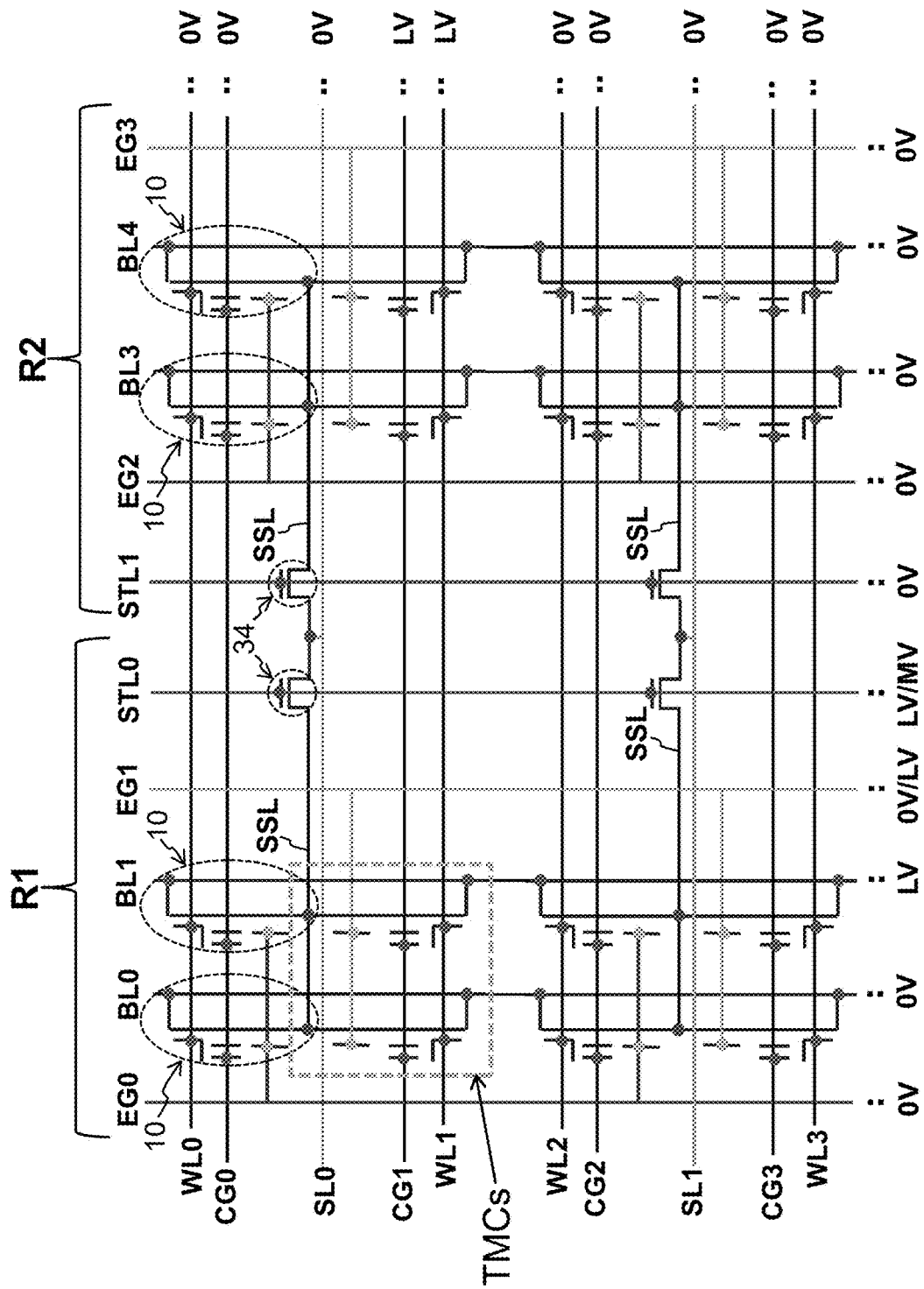
FIG. 13 is a diagram showing exemplary read operation voltages for the second embodiment of a memory array architecture.

FIG. 10 illustrates exemplary voltages for erasing all the memory cells 10 on word line WL1 in region R1 (i.e., TMCs, because only those cells are subjected to a high erase gate line voltage without a countering positive control gate line inhibit voltage). To enhance erasure, a negative voltage (e.g. –HV) could be applied to CG1, instead of 0V. FIGS. 11 and 12 illustrate two different exemplary voltage combinations for programming one of the memory cells 10 (right hand cell of the TMCs). FIG. 13 illustrates exemplary voltages for reading one of the memory cells 10 (right hand cell of the TMCs).

Figure 14:
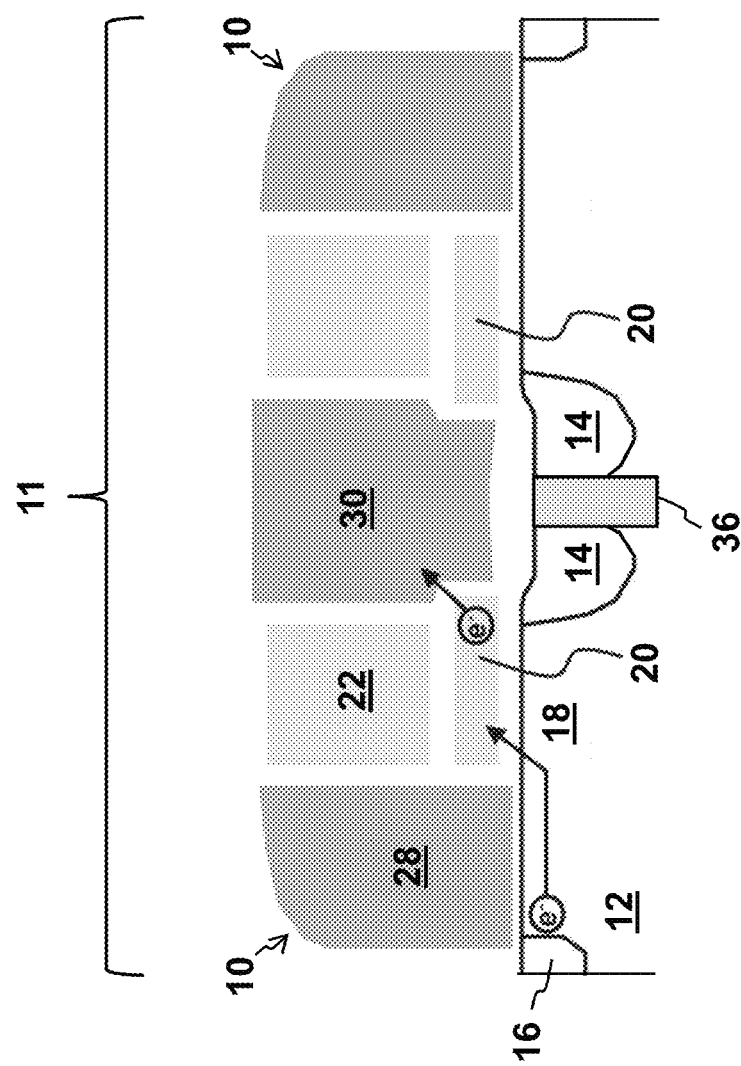
FIG. 14 is a cross sectional view of a third embodiment of a memory cell.
Figure 15:
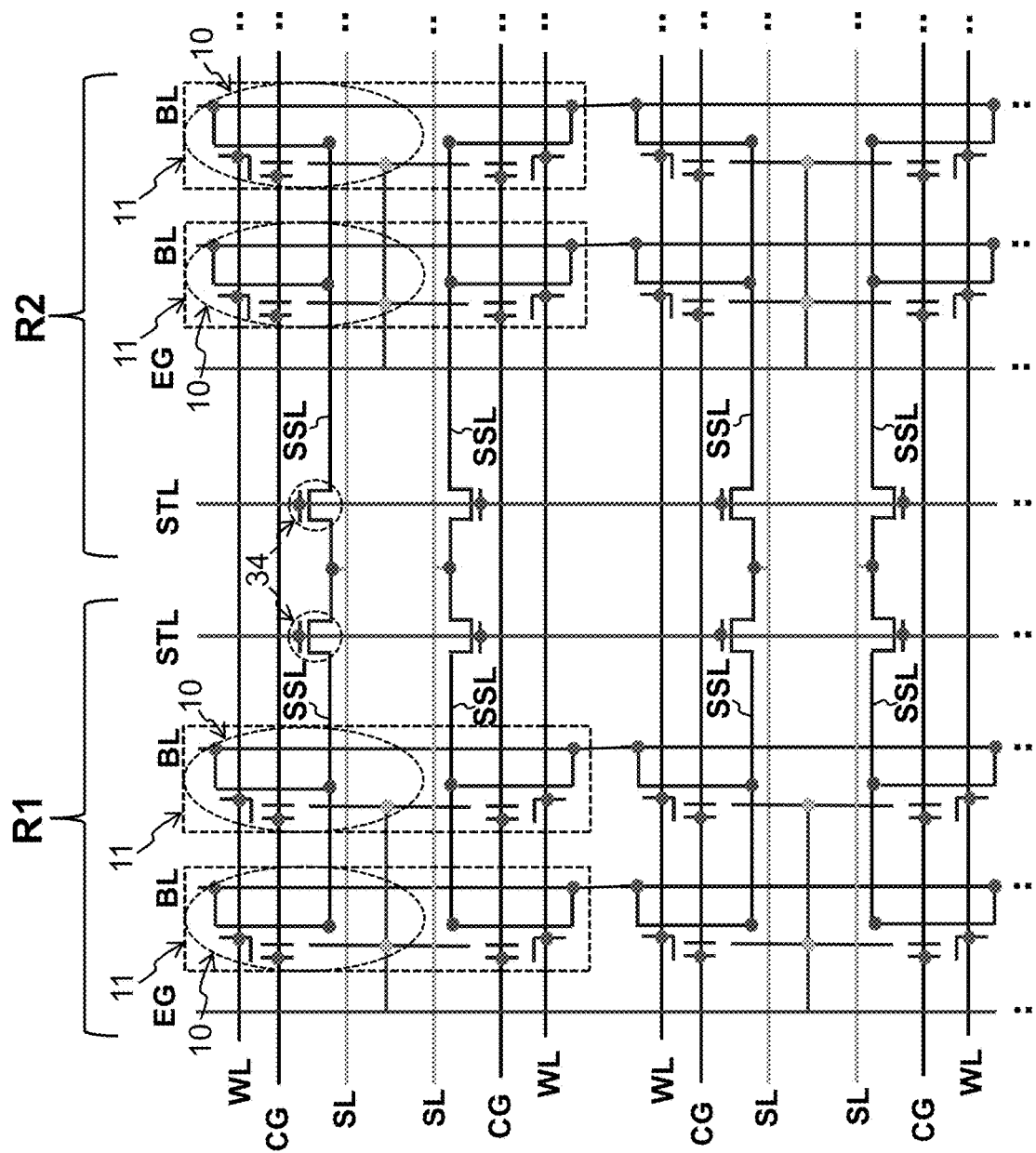
FIG. 15 is a diagram showing a third embodiment of a memory array architecture.

FIGS. 14-19 illustrate a third embodiment, which is similar to the embodiment of FIGS. 3-7, except that for each memory cell pair 11, a separate source region 14 is formed for each of the two memory cells 10 (i.e., each of the memory cells 10 sharing a common erase gate 30 has its own source region 14 isolated from the other source region 14 for the other memory cell 10) as shown in FIG. 14. Preferably, the source regions 14 are separated by STI 36 (shallow trench isolation such as oxide). FIG. 15 illustrates the memory cell array architecture for the memory cell configuration of FIG. 14, which is the same as that shown in FIG. 3 except that each individual subrow of memory cells 10 in each region R includes its own sub source line SSL and select transistor 34, and each row of memory cells 10 extending across all the regions R includes its own source line SL (compared to sharing a sub source line SSL, select transistor 34, and source line SL between two adjacent rows of memory cells 10—one row of memory cell pairs 11). By using two different sub source lines SSL and source lines SL for two different adjacent rows of memory cells 10 in a single row of memory cell pairs 11, disturb stress on adjacent, non-targeted cells can be reduced.

Figure 16:
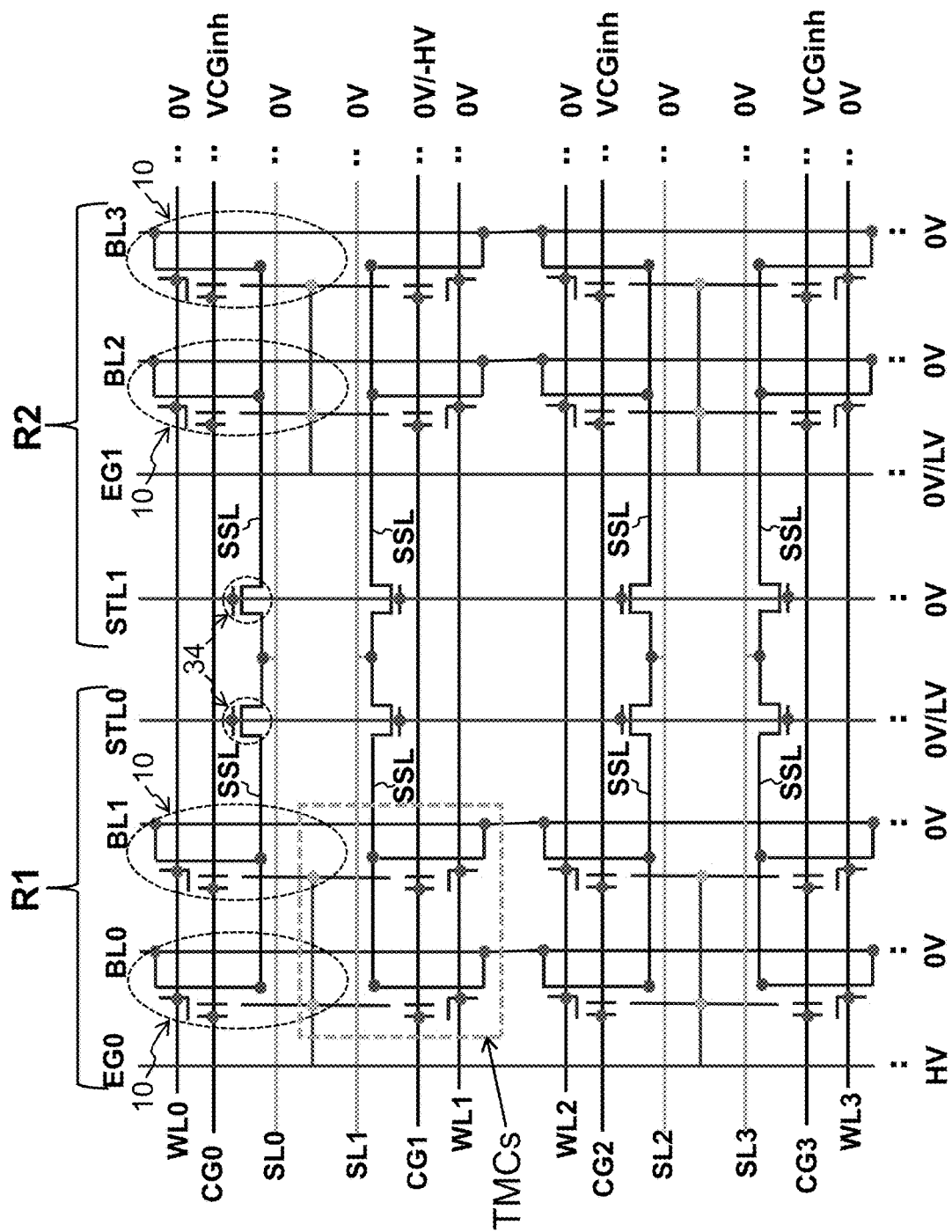
FIG. 16 is a diagram showing exemplary erase operation voltages for the third embodiment of a memory array architecture.
Figure 17:
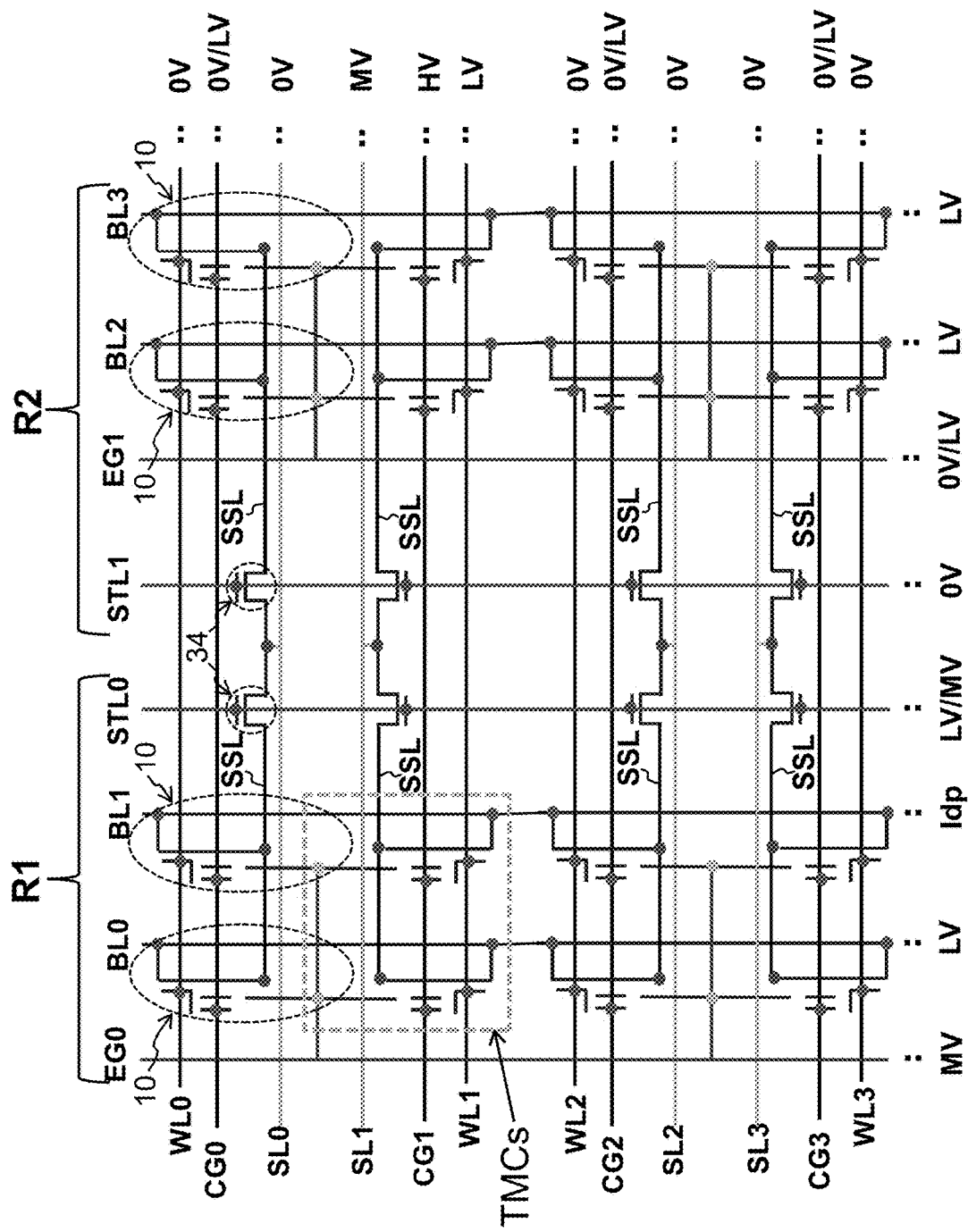
FIGS. 17-18 are diagrams showing exemplary program operation voltages for the third embodiment of a memory array architecture.
Figure 18:
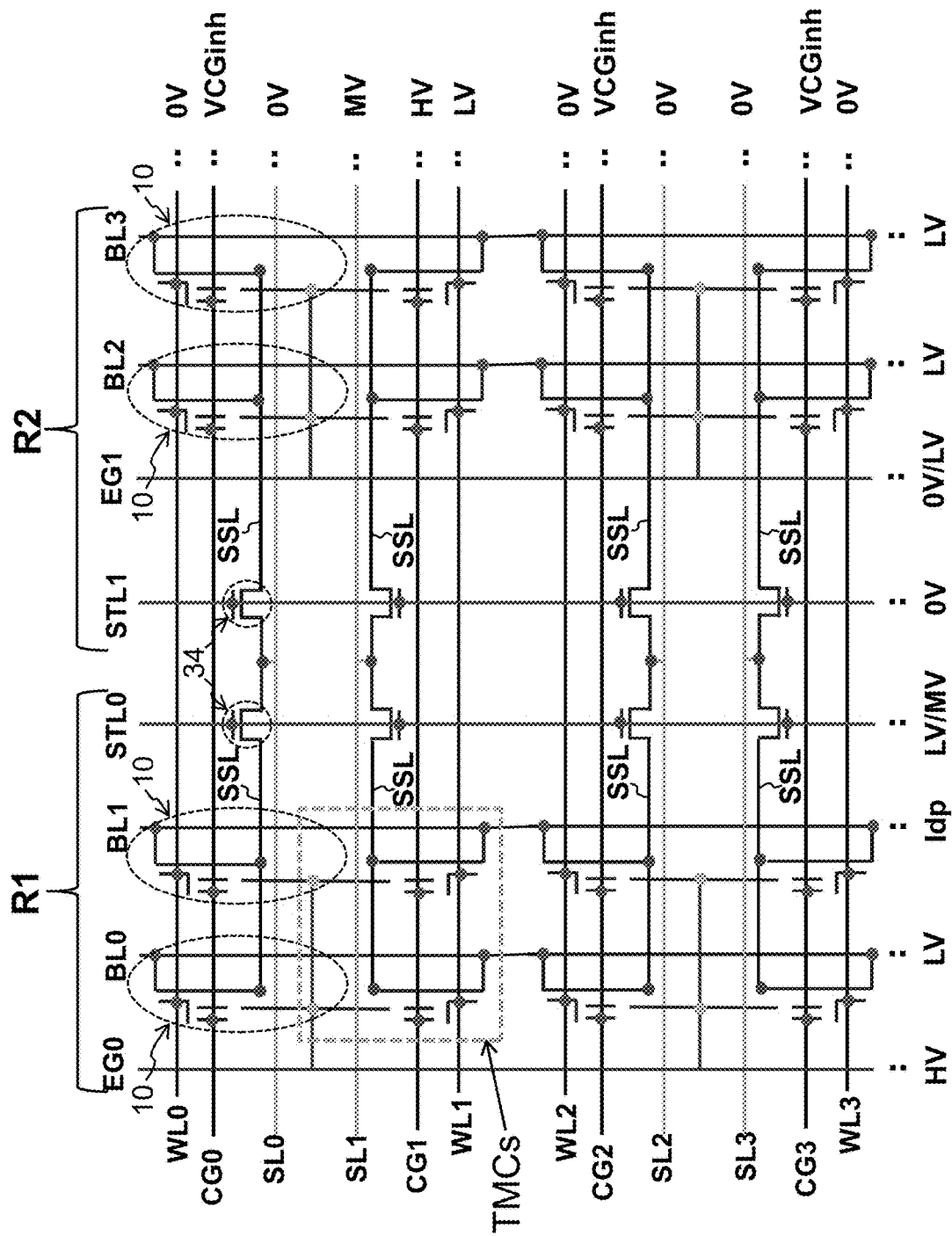
Figure 19:
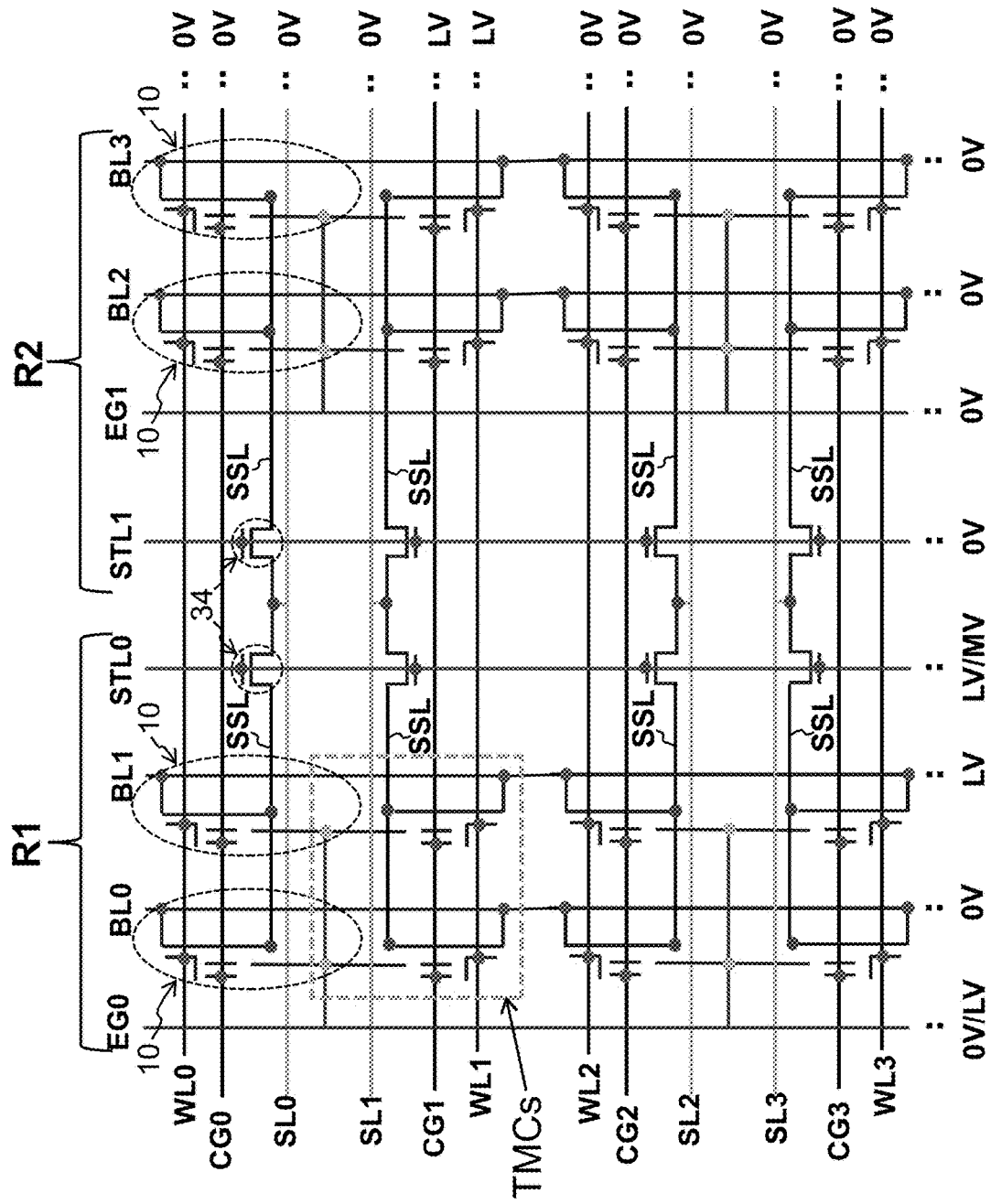
FIG. 19 is a diagram showing exemplary read operation voltages for the third embodiment of a memory array architecture.

FIG. 16 illustrates exemplary voltages for erasing all the memory cells on word line WL1 in region R1 (i.e., TMCs, because only those memory cells are subjected to a high erase gate line voltage without a countering positive control gate line inhibit voltage). To enhance erasure, a negative voltage (e.g. –HV) could be applied to CG1, instead of 0V. FIGS. 17 and 18 illustrate two different exemplary voltage combinations for programming one of the memory cells 10 (right hand cell of the TMCs). FIG. 19 illustrates exemplary voltages for reading one of the memory cells 10 (right hand cell of the TMCs).

Figure 20:
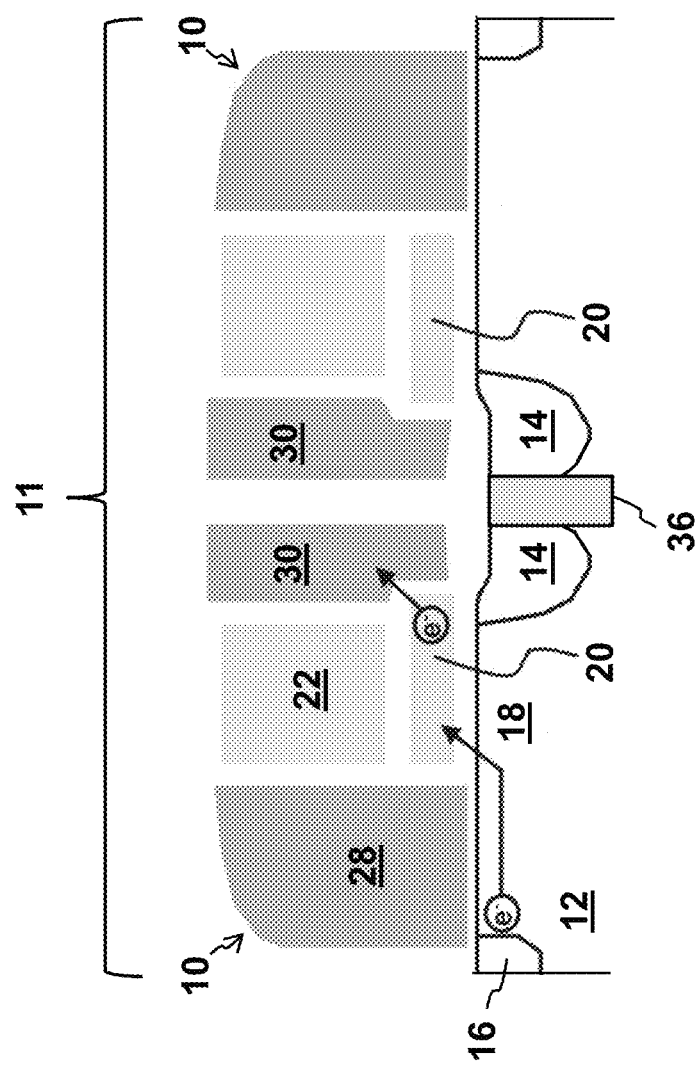
FIG. 20 is a cross sectional view of a fourth embodiment of a memory cell.
Figure 21:
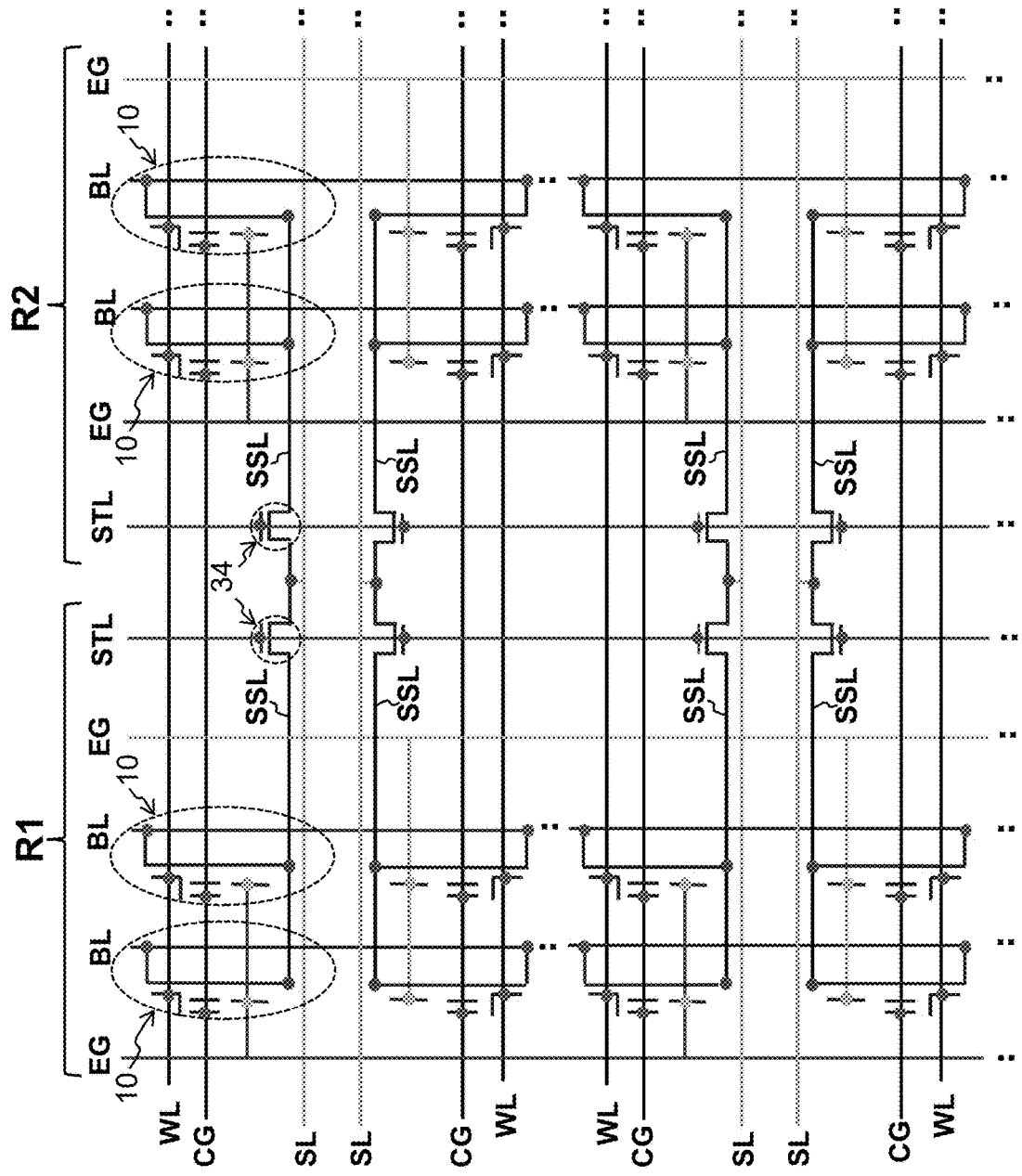
FIG. 21 is a diagram showing a fourth embodiment of a memory array architecture.

FIGS. 20-25 illustrate a fourth embodiment, which is similar to the embodiment of FIGS. 3-7, except that for each memory cell pair 11, a separate source region 14 is formed for each of the two memory cells 10 (i.e., each of the memory cells 10 has its own source region 14 isolated from the other source region 14 for the other memory cell 10), and that separate erase gates 30 are formed for each memory cell 10 in the pair of memory cells 11 (i.e., each of the memory cells 10 has its own erase gate 30 isolated from the other erase gate 30 for the other memory cell) as shown in FIG. 20. Preferably, the source regions 14 are separated by STI 36 (shallow trench isolation such as oxide). FIG. 21 illustrates the memory cell array architecture for the memory cell configuration of FIG. 20, which is the same as that shown in FIG. 3 except that (1) each individual subrow of memory cells 10 in each region R includes its own sub source line SSL and select transistor 34, and each row of memory cells 10 extending across all the regions R includes its own source line SL (compared to sharing a sub source line SSL, select transistor 34, and source line SL between two adjacent rows of memory cells 10—one row of memory cell pairs 11), and (2) that each region R of memory cells 10 includes two erase gate lines EG instead of one (i.e., for each region R, one erase gate line EG electrically connects together all the erase gates 30 in the odd rows of memory cells 10, and the other erase gate line EG electrically connects together all the erase gates 30 in the even rows of memory cells 10, for that region R). By using two different sub source lines SSL and source lines SL for two different adjacent rows of memory cells 10 in a single row of memory cell pairs 11, and by using two erase gate lines EG in each region R instead of one, disturb stress on adjacent, non-targeted cells can be reduced.

Figure 22:
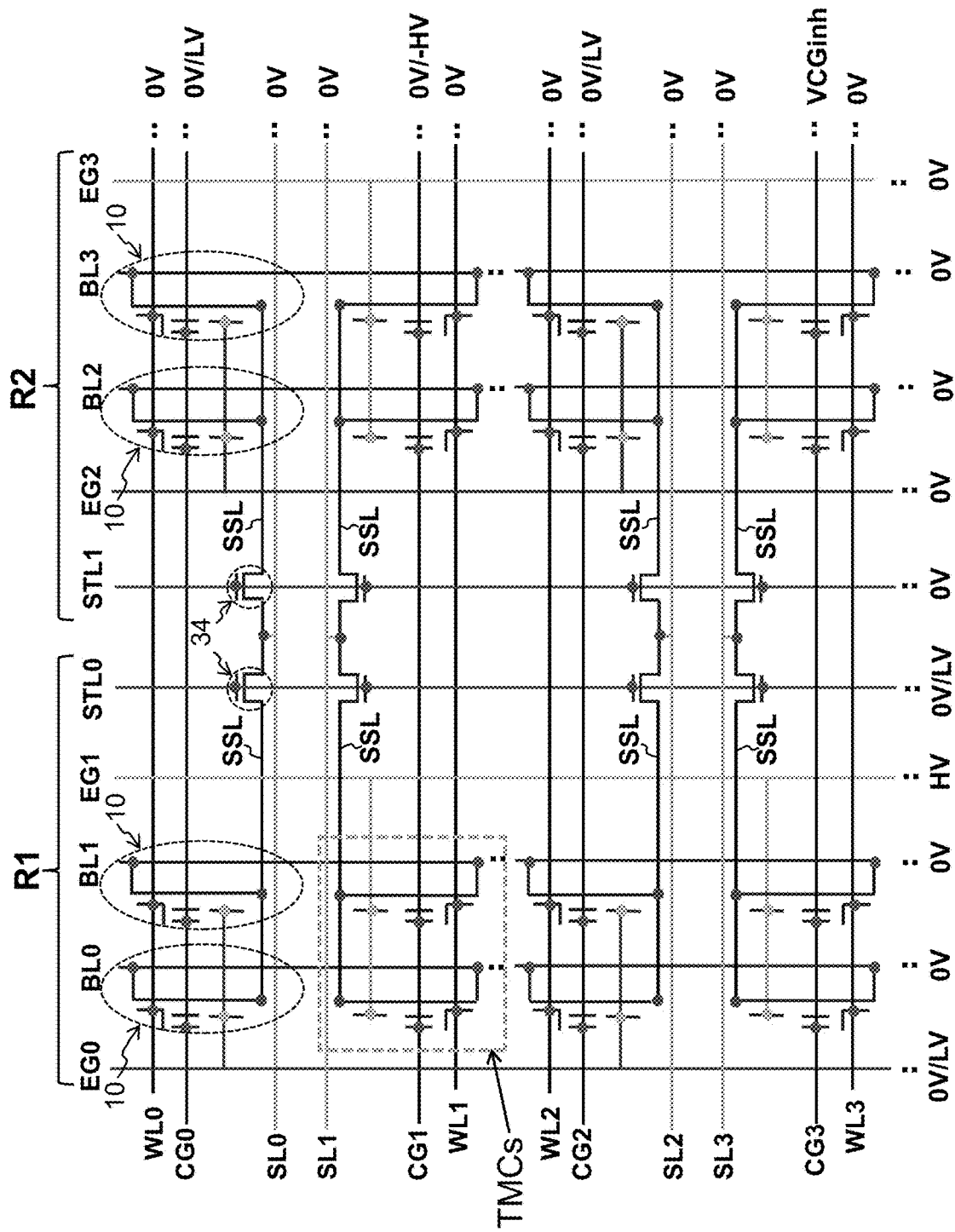
FIG. 22 is a diagram showing exemplary erase operation voltages for the fourth embodiment of a memory array architecture.
Figure 23:
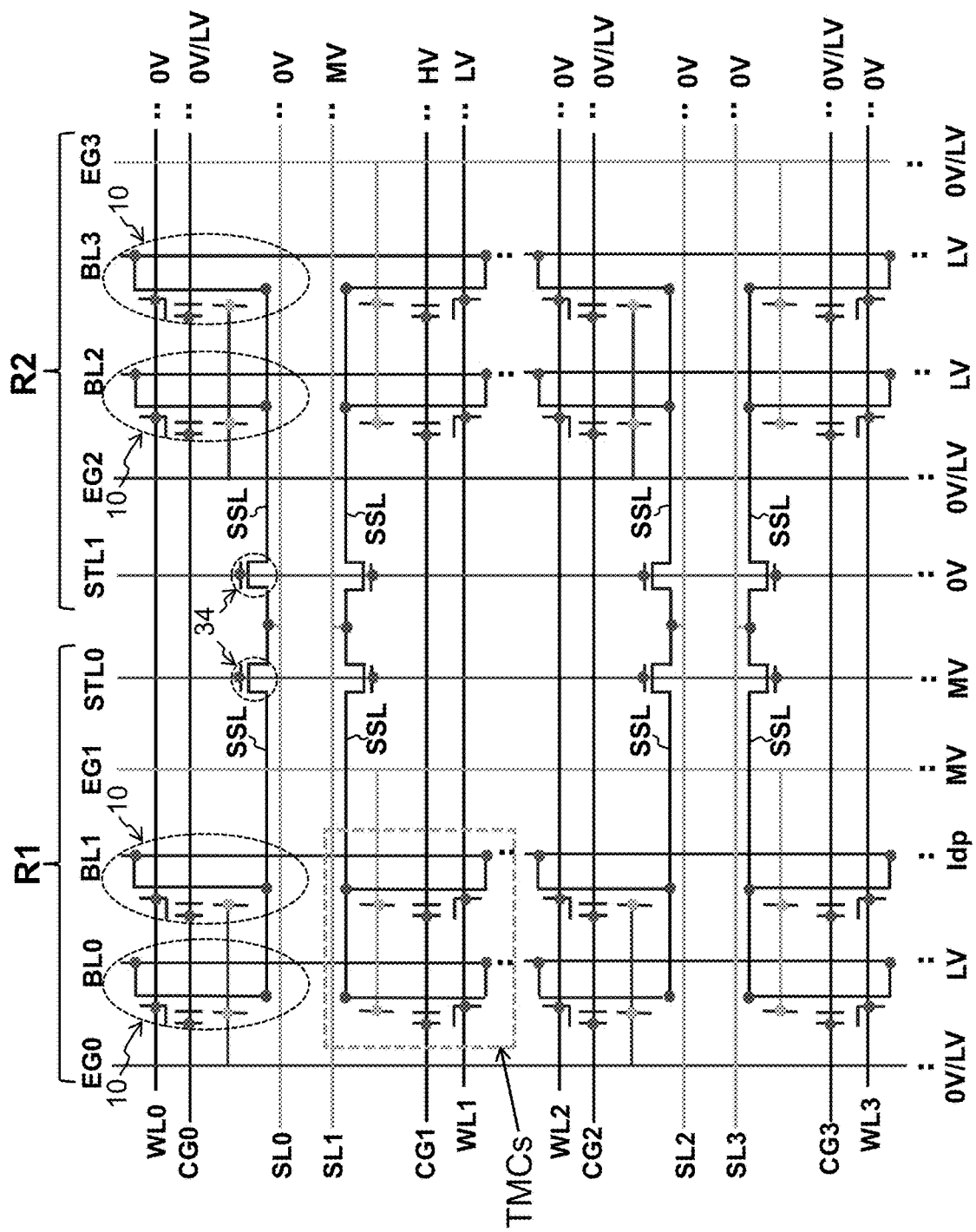
FIGS. 23-24 are diagrams showing exemplary program operation voltages for the fourth embodiment of a memory array architecture.
Figure 24:
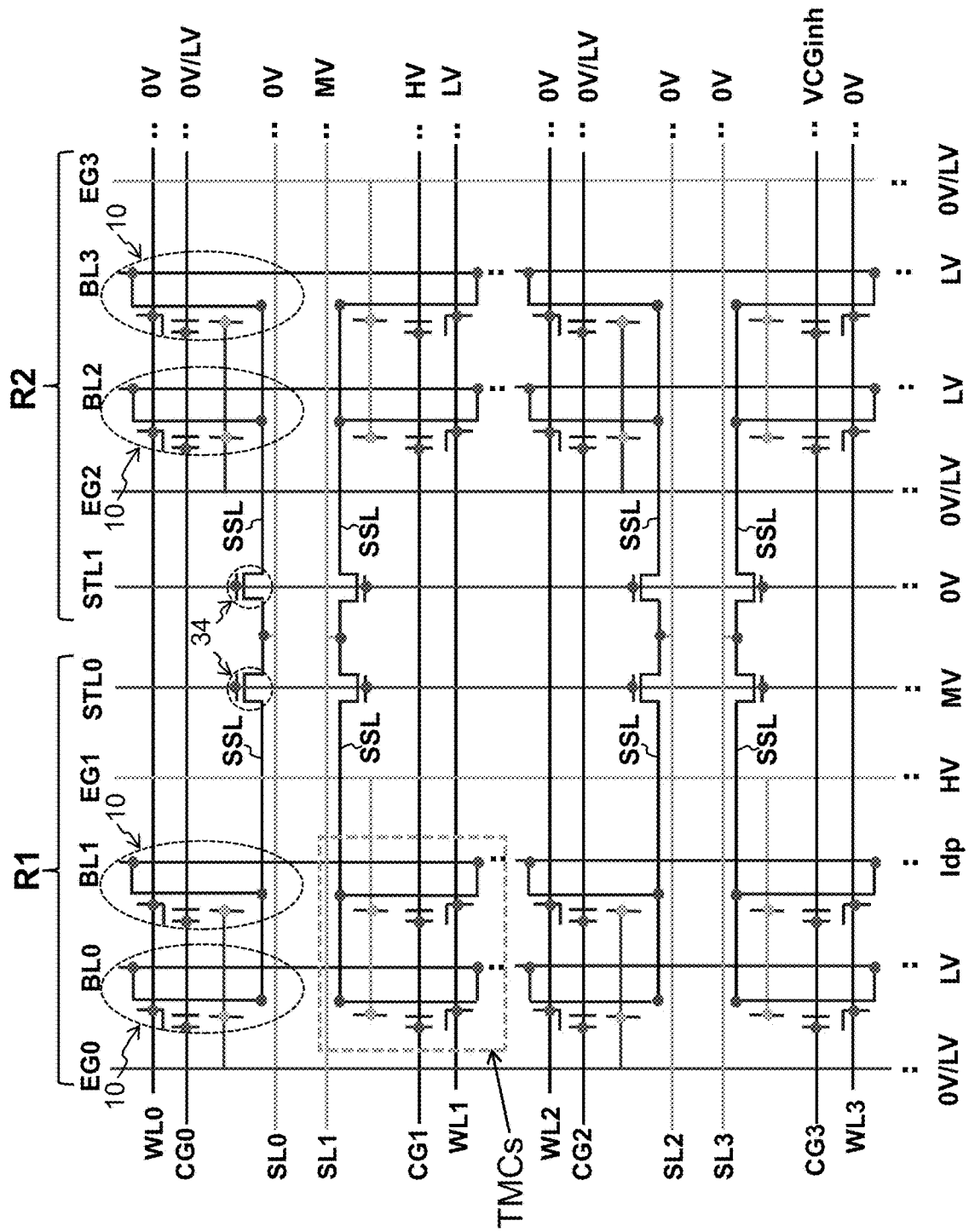
Figure 25:
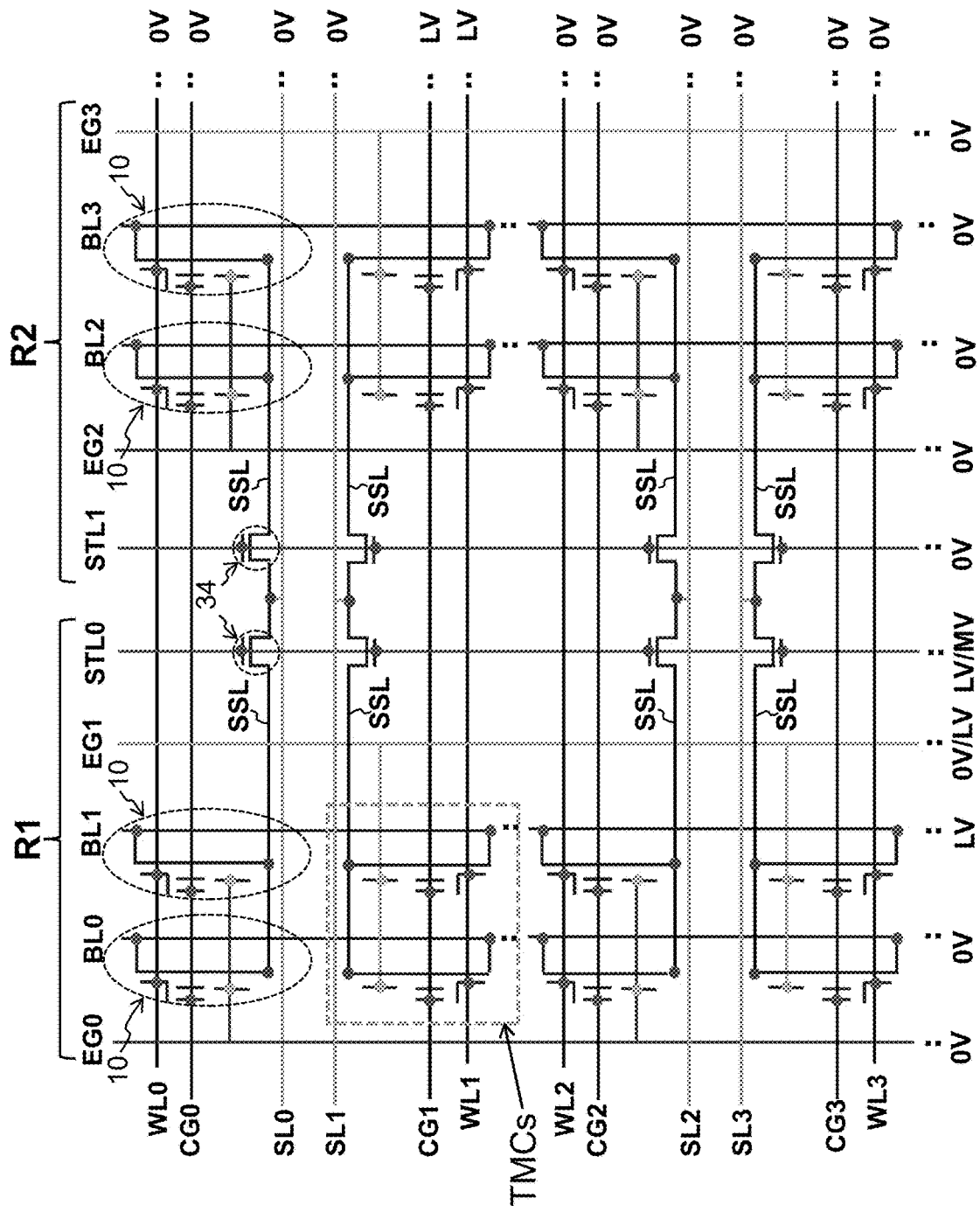
FIG. 25 is a diagram showing exemplary read operation voltages for the fourth embodiment of a memory array architecture.

FIG. 22 illustrates exemplary voltages for erasing all the memory cells on word line WL1 in region R1 (i.e., TMCs, because only those memory cells are subjected to a high erase gate line voltage without a countering positive control gate line inhibit voltage). To enhance erasure, a negative voltage (e.g., –HV) could be applied to CG1, instead of 0V. FIGS. 23 and 24 illustrate two different exemplary voltage combinations for programming one of the memory cells 10 (right hand cell of the TMCs). FIG. 25 illustrates exemplary voltages for reading one of the memory cells 10 (right hand cell of the TMCs).

Figure 26:
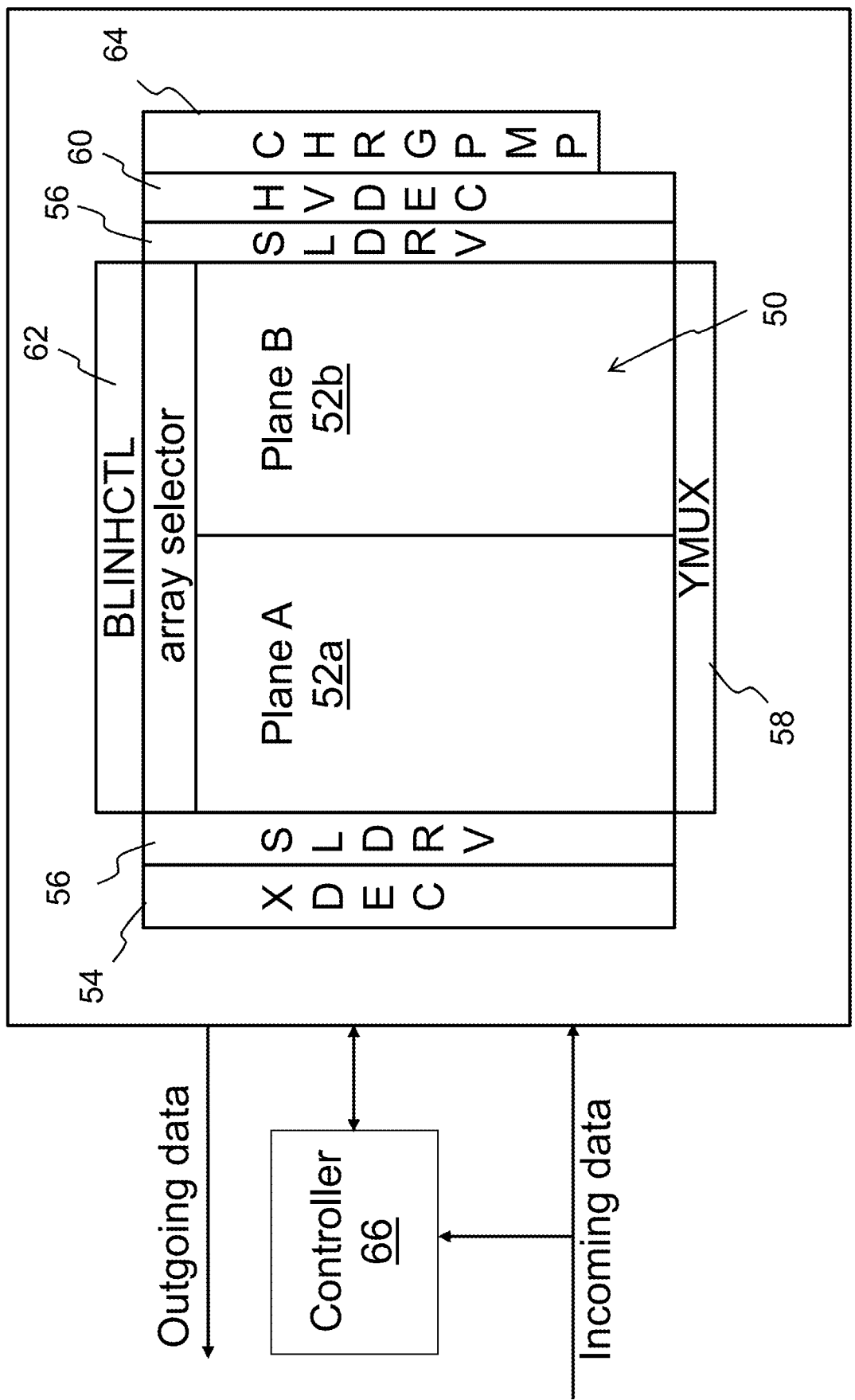
FIG. 26 is a diagram showing the architecture of an exemplary memory device.

The architecture of an exemplary memory device is illustrated in FIG. 26. The memory device includes an array 50 of the non-volatile memory cells 10, which can be segregated into two separate planes (Plane A 52a and Plane B 52b). The memory cells 10 can be of the type shown in FIGS. 1, 8, 14 and 20 formed on a single chip, arranged in a plurality of rows and columns in the semiconductor substrate 12 as depicted in FIGS. 3-7, 9-13, 15-19 and 21-25. Adjacent to the array of non-volatile memory cells are address decoders, such as low voltage LV row decoder (e.g., XDEC 54), source line driver (e.g. SLDRV 56), column decoder (e.g. YMUX 58), high voltage row decoder (e.g. HVDEC 60) and a bit line controller (BLINHCTL 62), which are used to decode addresses and supply the various voltages to the various memory cell gates and regions during read, program, and erase operations for selected memory cells. Column decoder 58 includes a sense amplifier containing circuitry for measuring the currents on the bit lines during a read operation. Controller 66 (containing control circuitry) controls the various device elements to implement each operation (program, erase, read) on target memory cells, including the peripheral circuits mentioned above as well as the select transistors 34 inside the memory array, to provide the signals on the various lines including the select transistor lines STL. Charge pump CHRGPMP 64 provides the various voltages used to read, program and erase the memory cells under the control of the controller 66. Controller 66 is configured to operate the memory device to program, erase and read the memory cells 10.

For all the above described embodiments, the total size of the array is only moderately increased (to make room for the select transistors and their lines), which is a worthwhile tradeoff for being able to erase only a single sub row of memory cells 10 at any given time, and selectively apply voltages only on certain sub source lines SSL during operation to increase performance. Moreover, the select transistors can be added to the memory array without otherwise materially changing the remaining portions of the memory array and the process flow in forming it.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Further, as is apparent from the claims and specification, not all method steps need be performed in the exact order illustrated or claimed, but rather in any order that allows the proper formation of the memory device of the present invention. Single layers of material could be formed as multiple layers of such or similar materials, and vice versa. Materials, processes and numerical examples described above are exemplary only, and should not be deemed to limit the claims. For example, applying a 0V is the same as applying no voltage or grounding the line where the result is zero volts on the particular line. Additionally, while many of the applied voltages are indicated as 0V, applying a low positive or negative voltage for one or more of the indicated lines can produce the same desired results for programming, reading and erasing the memory cells. Finally, the numerical values disclosed above and in the figures can vary depending on the performance variations of the manufactured memory cell array.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:
1. A memory device, comprising:
a plurality of memory cells configured in rows and columns on a semiconductor substrate, wherein each of the memory cells includes:
source and drain regions formed in the substrate and defining a channel region of the substrate extending there between,
a floating gate disposed vertically over and insulated from a first portion of the channel region,
a select gate disposed vertically over and insulated from a second portion of the channel region,
a control gate disposed vertically over and insulated from the floating gate, and
an erase gate disposed vertically over and insulated from the source region;
a plurality of word lines each electrically directly connecting together all of the select gates for one of the rows of the memory cells;
a plurality of control gate lines each electrically directly connecting together all of the control gates for one of the rows of the memory cells;
a plurality of bit lines each electrically directly connecting together all of the drain regions for one of the columns;
a plurality of first sub source lines each electrically directly connecting together the source regions of the memory cells that are in one of the rows of the memory cells and are in a first plurality of the columns;
a plurality of second sub source lines each electrically directly connecting together the source regions of the memory cells that are in one of the rows of the memory cells and are in a second plurality of the columns, wherein the first plurality of the columns is different from the second plurality of the columns;
a first erase gate line electrically directly connecting together all of the erase gates of the memory cells in the first plurality of the columns;
a second erase gate line electrically directly connecting together all of the erase gates of the memory cells in the second plurality of the columns;
a plurality of source lines;
a plurality of first select transistors each connected between one of first sub source lines and one of the source lines;
a plurality of second select transistors each connected between one of second sub source lines and one of the source lines;
a first select transistor line connected to gates of the first select transistors; and
a second select transistor line connected to gates of the second select transistors.

2. The memory device of claim 1, wherein for each of the source lines, one of the first select transistors connected thereto is connected to one of the first sub source lines for a first row of the memory cells and one of the second select transistors connected thereto is connected to one of the second sub source lines for the first row of the memory cells.

3. The memory device of claim 1, further comprising:
a controller configured to perform an erase operation on a target group of the memory cells which are in the first plurality of the columns and are connected to a first of the control gate lines, by:
applying a positive voltage to the first erase gate line;
applying a zero voltage or a negative voltage to the first control gate line; and
applying a positive voltage to all of the control gate lines except the first control gate line.

4. The memory device of claim 3, wherein the controller is configured to perform the erase operation further by applying a zero voltage or a voltage below a threshold voltage of the first select transistors to the first select transistor line.

5. The memory device of claim 4, wherein the controller is configured to perform the erase operation further by applying a zero voltage to the second select transistor line.

6. The memory device of claim 1, further comprising:
a controller configured to perform a program operation on one of the memory cells in the first plurality of the columns, wherein the one memory cell is connected to a first of the word lines, and a first of the control gate lines, by:
applying a positive voltage to the first word line;
applying a positive voltage to the first control gate line;
applying a positive voltage to the first erase gate line; and
applying a positive voltage to the first select transistor line.

7. The memory device of claim 6, wherein the controller is configured to perform the program operation further by applying a zero voltage to the second select transistor line.

8. The memory device of claim 1, wherein:
each of the first sub source lines electrically directly connects together the source regions of the memory cells that are in a second one of the rows of the memory cells and that are in the first plurality of the columns; and
each of the second sub source lines electrically directly connects together the source regions of the memory cells that are in a second one of the rows of the memory cells and that are in the second plurality of the columns.

9. The memory device of claim 1, wherein:
for each one of the first sub source lines, all of the source regions electrically directly connected together by the one first sub source line are for memory cells in only one of the rows of the memory cells; and
for each one of the second sub source lines, all of the source regions electrically directly connected together by the one second sub source line are for memory cells in only one of the rows of the memory cells.

10. A memory device, comprising:
a plurality of memory cells configured in alternating even and odd rows, and in columns, on a semiconductor substrate, wherein each of the memory cells includes:
source and drain regions formed in the substrate and defining a channel region of the substrate extending there between,
a floating gate disposed vertically over and insulated from a first portion of the channel region,
a select gate disposed vertically over and insulated from a second portion of the channel region,
a control gate disposed vertically over and insulated from the floating gate, and
an erase gate disposed vertically over and insulated from the source region;
a plurality of word lines each electrically directly connecting together all of the select gates for one of the rows of the memory cells;
a plurality of control gate lines each electrically directly connecting together all of the control gates for one of the rows of the memory cells;
a plurality of bit lines each electrically directly connecting together all of the drain regions for one of the columns;
a plurality of first sub source lines each electrically directly connecting together the source regions of the memory cells that are in one of the rows of the memory cells and are in a first plurality of the columns;
a plurality of second sub source lines each electrically directly connecting together the source regions of the memory cells that are in one of the rows of the memory cells and are in a second plurality of the columns, wherein the first plurality of the columns is different from the second plurality of the columns;
a first erase gate line electrically directly connecting together all of the erase gates of the memory cells that are in the even rows of the memory cells and are in the first plurality of the columns;
a second erase gate line electrically directly connecting together all of the erase gates of the memory cells that are in the odd rows of the memory cells and are in the first plurality of the columns;
a third erase gate line electrically directly connecting together all of the erase gates of the memory cells that are in the even rows of the memory cells and are in the second plurality of the columns;
a fourth erase gate line electrically directly connecting together all of the erase gates of the memory cells that are in the odd rows of the memory cells and are in the second plurality of the columns;
a plurality of source lines;
a plurality of first select transistors each connected between one of first sub source lines and one of the source lines;
a plurality of second select transistors each connected between one of second sub source lines and one of the source lines;
a first select transistor line connected to gates of the first select transistors; and
a second select transistor line connected to gates of the second select transistors.

11. The memory device of claim 10, wherein for each of the source lines, one of the first select transistors connected thereto is connected to one of the first sub source lines for a first one of the rows of the memory cells and one of the second select transistors connected thereto is connected to one of the second sub source lines for the first one of rows of the memory cells.

12. The memory device of claim 10, further comprising:
a controller configured to perform an erase operation on a target group of the memory cells which are in the first plurality of the columns, are connected to a first of the control gate lines, and are connected to the second erase gate line, by:
applying a positive voltage to the second erase gate line;

applying a zero voltage or a negative voltage to the first control gate line;
applying a positive voltage to all of the control gate lines that are connected to the memory cells which are also connected to the second erase gate line except the first control gate line.

13. The memory device of claim 12, wherein the controller is configured to perform the erase operation further by applying a zero voltage to all the control gate lines that are connected to the memory cells which are also connected to the first erase gate line.

14. The memory device of claim 12, wherein the controller is configured to perform the erase operation further by applying a low positive voltage to all the control gate lines that are connected to the memory cells which are also connected to the first erase gate line, where the low positive voltage is less than the positive voltage applied to all of the control gate lines that are connected to the memory cells which are also connected to the second erase gate line except the first control gate line.

15. The memory device of claim 12, wherein the controller is configured to perform the erase operation further by applying a zero voltage or a voltage below a threshold voltage of the first select transistors to the first select transistor line.

16. The memory device of claim 15, wherein the controller is configured to perform the erase operation further by applying a zero voltage to the second select transistor line.

17. The memory device of claim 10, further comprising:
a controller configured to perform a program operation on one of the memory cells in the first plurality of the columns, wherein the one memory cell is connected to a first of the word lines, to the second erase gate line, and a first of the control gate lines, by:
applying a positive voltage to the first word line;
applying a positive voltage to the first control gate line;
applying a positive voltage to the second erase gate line; and
applying a positive voltage to the first select transistor line.

18. The memory device of claim 17, wherein the controller is configured to perform the program operation further by applying a zero voltage to the second select transistor line.

19. The memory device of claim 10, wherein:
each of the first sub source lines electrically directly connects together the source regions of the memory cells that are in a second one of the rows of the memory cells and that are in the first plurality of the columns; and
each of the second sub source lines electrically directly connects together the source regions of the memory cells that are in a second one of the rows of the memory cells and that are in the second plurality of the columns.

20. The memory device of claim 10, wherein:
for each one of the first sub source lines, all of the source regions electrically directly connected together by the one first sub source line are for memory cells in only one of the rows of the memory cells; and
for each one of the second sub source lines, all of the source regions electrically directly connected together by the one second sub source line are for memory cells in only one of the rows of the memory cells.

* * * * *